US012770781B2

(12) United States Patent
McDonald et al.

(10) Patent No.: US 12,770,781 B2
(45) Date of Patent: Oct. 20, 2026

(54) METHOD OF GENERATING NOVEL AIR GAP LAYOUTS FOR LAMINATED MAGNETIC CORE MINIATURE THIN FILM INDUCTORS AND TRANSFORMERS WITH A CONTINUOUS FUNCTION

(71) Applicant: Atlas Magnetics, Reno, NV (US)

(72) Inventors: John Othniel McDonald, Reno, NV (US); Osman Ersed Akcasu, Cardiff-by-the-Sea, CA (US)

(73) Assignee: Atlas Magnetics, Reno, NV (US)

( * ) Notice: Subject to any disclaimer, the term of this patent is extended or adjusted under 35 U.S.C. 154(b) by 1021 days.

(21) Appl. No.: 17/981,303

(22) Filed: Nov. 4, 2022

(65) Prior Publication Data

US 2023/0274879 A1 Aug. 31, 2023

Related U.S. Application Data

(63) Continuation-in-part of application No. 17/893,108, filed on Aug. 22, 2022.

(60) Provisional application No. 63/275,928, filed on Nov. 4, 2021.

(51) Int. Cl.

| | |
|---|---|
| ***G06F 30/12*** | (2020.01) |
| ***G06F 30/23*** | (2020.01) |
| ***G06F 30/39*** | (2020.01) |
| ***H01F 3/14*** | (2006.01) |
| ***H01F 41/02*** | (2006.01) |

(52) U.S. Cl.

CPC ......... *H01F 41/0206* (2013.01); *G06F 30/12* (2020.01)

(58) Field of Classification Search

CPC ........ H01F 41/0206; H01F 3/14; H01F 17/04; G06F 30/12; G06F 2111/10; G06F 30/23; G06F 30/39

See application file for complete search history.

(56) References Cited

U.S. PATENT DOCUMENTS

| | | | | |
|---|---|---|---|---|
| 5,609,946 | A * | 3/1997 | Korman | H01F 10/3254 428/209 |
| 6,583,701 | B2 * | 6/2003 | Sun | H01F 3/14 336/200 |
| 2004/0239470 | A1 * | 12/2004 | Lu | H03H 1/0007 336/212 |

OTHER PUBLICATIONS

Hofinger et al., Simulation Assisted Design of Inductors in Power Electronics Systems (Year: 2013).*

* cited by examiner

*Primary Examiner* — Rehana Perveen
*Assistant Examiner* — John David Hagler

(57) ABSTRACT

The present invention comprises a specially designed means of air gap optimization for magnetically permeable material used in electrical components, for example, inductors and transformers. First, an ideal inductance over current curve is selected, and a core start point, endpoint, start angle, and end angle are selected within the core or along the core edges. Given the ideal curve and the starting conditions, an air gap is designed which meets or comes as close as possible to the ideal curve selected. Multiple air gaps can be designed in a single core. The inclusion of novel partial air gaps enables curves to be reached that optimize the core for high and low currents.

18 Claims, 49 Drawing Sheets

METHOD OF GENERATING NOVEL AIR GAP LAYOUTS FOR LAMINATED MAGNETIC CORE MINIATURE THIN FILM INDUCTORS AND TRANSFORMERS WITH A CONTINUOUS FUNCTION

CROSS-REFERENCE TO RELATED APPLICATIONS

U.S. Provisional Patent Application No. 63/275,928, filed 4 Nov. 2021, the full disclosure of which is incorporated herein by reference and priority of which is hereby claimed.

U.S. Non-Provisional patent application Ser. No. 17/893,108, filed 22 Aug. 2022, the full disclosure of which is incorporated herein by reference and priority of which is hereby claimed.

BACKGROUND

The general field of the present invention relates to the use of magnetic flux in electrical circuits and components such as inductors and transformers. More specifically, the field of the present invention relates to air gaps in such systems.

In certain electrical circuit components such as inductors and transformers, a magnetic field is generated by a current run through a coiled wire. A change in this current will create magnetic flux, and the magnetic flux lines will pass through magnetic material which forms a component core. Each specific magnetic material used for a core has a maximum level of magnetic flux per area of material, and the max point for a given amount of material is known as the magnetic saturation point or $B_{SAT}$.

$B_{SAT}$ affects the inductance of a magnetic core. As the core fills with magnetic flux, it will not be able to take on more flux, this causes the magnetic field in a core to remain constant so that there is no longer an induced current. Therefore, a magnetic core will present a relatively flat inductance until the core approaches saturation, at which point the inductance value will rapidly drop. This effect is shown in FIG. 1.

Magnetic core (core) air gaps, as the name implies, are gaps in the magnetic core that otherwise form a loop around a wire coil. The air gaps need not be filled with air but may be filled with ABF "Ajinomoto Build-up Film" or with other materials, including permanent dry film, other epoxies, various oxides, or gasses. Essentially, an air gap can be filled with any material that has a much lower permeability than the main magnetic core material, but typically the air gap will have a relative permeability (μ) of near 1.

A traditional discrete air gap will cut through the width of the core, as shown in FIG. 2, where magnetic core 200 has air gap 210 cutting through the width of core 200.

The cut itself may have a unique cross-section that is typically vertical, as shown by the side view in FIG. 3, where magnetic core 300 has a vertical air gap 310, or diagonal, as shown by the side view in FIG. 4, where magnetic core 400 has a diagonal vertical air gap 410. In some instances, air gaps have a cross-section that varies with depth, as shown by the side view in FIG. 5, where air gap 500 has a sloped air gap 510. Regardless of the cross-sectional shape of the air gap, traditional discrete gaps present as a line from the first edge of the core to the second edge, typically a core winding window edge.

The second form of air gap core occurs in a powder core. A core is created from a powdered material leaving a uniform distribution of gaps throughout the core. The gaps are created between the particulates of the core material.

This core will present a softer drop in inductance as the core material approaches the $B_{SAT}$ limit.

Whether in a powder core or a discrete gapped core, an air gap will decrease the relative permeability of the core. As the permeability of the core decreases, the amount of current required to generate a magnetic field in the core will increase. This allows the core to be used in higher current applications without the associated rapid loss of inductance. However, as a reduced core permeability requires a higher current to generate inductance it is not usable at lower current ranges. Thus, reducing permeability by classic air gap means does not optimize a single core for both high and low inductance.

Understanding the relationship between inductance and the magnetic field is important. In certain electrical circuit components, such as inductors and transformers, the relation between current I and magnetic field $\vec{H}$ is given by Ampere's law given as $$\oint \vec{H} d\vec{l} = \sum_{k=1}^{n} I_k \tag{1}$$

Where it states that the line integral of the magnetic field in a closed path equals the sum of currents "penetrating" the enclosed surface by the closed path selected.

Classically the air gap is introduced directly perpendicular to the magnetic flux lines, usually across a section of the magnetic core through which all the magnetic flux flows as shown in FIG. 6.

The magnetic flux $\phi$ is defined by the surface integral, $$\phi = \int\int \vec{B} d\vec{A} \tag{2}$$

where $\vec{B}$ is magnetic flux density. The surface integral is performed at a given surface of interest. Applying Ampere's law, assuming the flux continuity, $\vec{B}$ being uniform in the cross-section and some additional assumptions to the very basic and simple magnetic circuit having an air gap in FIG. 2 gives $$R_m = \frac{l_c}{A_c \mu_m} \quad R_g = \frac{g}{A_g \mu_0} \tag{3}$$

Where $A_c$, $l_c$, $\mu_m$, g, $\mu_0$ and $A_g$ are the effective cross-sectional area, effective average length, and the magnetic permeability of the magnetic path of the magnetic core, effective air gap spacing, permeability of the free space and the effective cross-sectional area of the air gap respectively. $R_m$ and $R_g$ in (3) are the reluctances of the magnetic path and the air gap respectively, which are equivalent to resistance in the electrical circuits. The procedure is called "air-gap," but the concept can be generalized by having the "gap" in the magnetic core having smaller magnetic permeability much smaller compared to the magnetic core magnetic permeability replacing $\mu_0$ with $\mu_g$ in (3), where $\mu_g$ is the magnetic permeability of the "gap".

Typically, $\mu_m >> \mu_g$ which results in $R_g >> R_m$ giving inductance L of the magnetic circuit, as shown in FIG. 6, approximated as, $$L = \frac{N\phi}{l_g} \tag{4}$$

N and $l_g$ are the number of turns in the winding and the average length of the air gap respectively. The current I will create the magnetic flux, and the magnetic flux lines will pass through the magnetic material incorporated into the component, typically as a silicon steel laminated core (as in power-line transformers) or ferrite ceramic cores (as in consumer-grade inductors). As the current in the coil increases, the magnetic flux being generated also increases inside the magnetic core material until a point is reached called Magnetic flux saturation, after which increasing current only creates magnetic flux proportional to air which has a relative permeability $\mu_r$ of very near 1. This can be seen very clearly by the B-H curves for several magnetic steel used in transformers and inductors and typical Ferrites for higher frequency applications in FIG. 3. B-H relation in Maxwell's equations is explicitly given as, $$\vec{B} = \mu\vec{H} \tag{5}$$

Where H, B and μ are magnetic fields in (A/m, Ampere/meter), magnetic flux density in $Wb/m^2$ (Weber/meter square) or T (Tesla) and magnetic permeability in (H/m, Henry/meter) respectively. Moreover, magnetic permeability μ is $$\mu = \mu_0\mu_r \tag{6}$$

Were $\mu_0$ and $\mu_r$ are magnetic permeability of free space in (H/m) which is $4\pi\times10^{-7}=1.25663\times10^{-6}$ (H/m) and relative magnetic permeability of the material, which is a dimensionless quantity and $\mu_r=1$ for free space, respectively.

The slope of the B-H curve or in other words B (H) curve shown in FIG. 3, gives the $\mu_r$ in (6). Some numerical values for $\mu_r$ are given in Table 1.

TABLE 1

| Material | $\mu_r$ | B (Tesla) |
|---|---|---|
| Electrical Steel | 4,000 | 0.002 |
| Iron | 5,000 | |
| Permalloy | 100,000 | 0.002 |
| Nickel | 100-600 | 0.002 |
| Metglas 2714A | 1,000,000 | 0.5 |
| Ferrite (Magnesium-Manganese-Zinc) | 350-500 | 0.00025 |
| Ferrite (Manganese-Zinc) | 350-20,000 | 0.00025 |
| Ferrite (Cobalt-Nickel-Zinc) | 40-125 | 0.001 |
| Ferrite (Nickel-Zinc) | 10-2,300 | <0.0005 |
| Martensitic Stainless Steel (Hardened) | 40-95 | |
| Martensitic Stainless Steel (Annealed) | 750-950 | |

Non-linearities in B-H characteristics as shown in FIG. 7,

The inductance formula in (4), with the help of (5) and (6) by approximation of uniform magnetic field in an "effective magnetic core/air gap area" $A_{eff}$, combined with an "effective relative magnetic permeability" $\mu_{reff}$, can be approximated by, $$L = \frac{\mu_0\mu_{reff}}{l_g}A_{eff}N^2 \tag{7}$$

Non-linearities in B-H characteristics as shown in FIG. 7, frequency dependencies of $\mu_r$ as shown in FIG. 6 and complexity introduced by the geometries even for the "relaxed" traditional inductor/transformer geometries makes the solution of the problem of inductance and flux calculations—a much more complex and involved than given in (4) and (7). However, air gap design and optimization work for the miniature inductors with laminated cores as show in FIG. 8-12 which can be far more complex.

FIG. 8 shows a miniature inductor with a laminated core design which has a x dimension of 0.7281 mm, and a y dimension of 0.7281 mm, with 12 coil turns, a DC coil resistance of 111.7 mOhm, and a core thickness of 8.0 mm. The inductance of this miniature inductor is generally 56.4 nH until saturation.

FIG. 9 shows a miniature inductor with a laminated core which has a x dimension of 0.7512 mm and a y dimension of 0.5528 mm with 5.5 coil turns, a DC coil resistance of 58.0 Ohm, and core thickness of 8.0 mm. The inductance of this miniature inductor is generally 25.5 nH until saturation.

FIG. 10 shows a miniature inductor with a laminated core design which has a size which has a x dimension of 0.620 mm and a y dimension of 0.70 mm, with 5 coil turns, a DC coil resistance of 63.9 mOhm, and a core thickness of 8.0 mm. The inductance of this miniature inductor is generally 36.5 nH until saturation.

FIG. 11 shows a miniature inductor with a laminated core design which has a size which has a x dimension of 0.6693 mm and a y dimension of 0.7481 mm, with 6 coil turns, a DC coil resistance of 42.2 mOhm, and a core thickness of 8.0 mm. The inductance of this miniature inductor is generally 25.1 nH until saturation.

FIG. 12 shows a miniature inductor with a laminated core design which has a size which has a x dimension of 0.7383 mm and a y dimension of 0.7481 mm, with 6 coil turns, a DC coil resistance of 32.5 mOhm, and a core thickness of 8.0 mm. The inductance of this miniature inductor is generally 27.2 nH until saturation.

As can be seen, the inductor geometry is very different from the elementary magnetics course material drawing as shown in FIG. 6. Having wide windings covering the entire magnetic core results in non-uniform current distributions in the windings as well as non-uniform magnetic field distribution in the magnetic core cross-section even in DC case! Therefore, the uniform magnetic field distribution in the magnetic core and the air gap assumptions that are the foundation of the inductance formulation given at (7) does not apply to the layout dimensions of the thin planar inductors shown in FIG. 8-12. Therefore, any calculation related to the miniature inductor structures like the one shown in FIG. 8-12 requires the solution of Maxwell's equation for the complex regions under investigation given as, $$\nabla\times\vec{E} = -\frac{\partial\vec{B}}{\partial t} \tag{8}$$

$$\nabla\times\vec{H} = \vec{j} + \frac{\partial\vec{D}}{\partial t} \tag{9}$$

$$\nabla\vec{D} = \rho \tag{10}$$

-continued $$\nabla\vec{B}=0 \tag{11}$$

$$\vec{D}=\varepsilon\vec{E} \tag{12}$$

Where $\vec{E}$, $\vec{H}$, $\vec{D}$ and $\vec{B}$ electric, magnetic, displacement and magnetic induction vectors respectively.

Some elegant vector algebra manipulation of Maxwell's equation leads to the Helmholtz wave equation for electric and magnetic fields, which makes it easier to deal with.

Having a magnetic core to increase the inductance value for a given volume introduces magnetic core losses to the system which are basically due to the eddy currents and hysteresis losses in the magnetic material in addition to the losses in the windings. Eddy current loss is already in the Maxwell's equation and the magnetic core loss mechanism can be most elegantly handled by the introduction of complex dielectric or magnetic permeability concept, which also can be measured.

Introducing complex dielectric or magnetic permeability concept to the Helmholtz wave equations brings generality to the equations and gives a better handle on high-frequency measurements given as, $$\mu=\mu_r'-j\mu_r'' \tag{13}$$

FIG. 13 shows $\mu'_r$ and $\mu''_r$ as a function frequency of a common ferrite material. As can be seen, the curves show significant frequency dependence, and this is true for any magnetic material.

The complex part in $\mu''_r$ (12) is responsible for the loss mechanism in the magnetic material. Magnitudes of the real and complex parts of (12) as a function of frequency puts the useful high-frequency operation limit of the magnetic materials.

Similar complex definitions can be done for complex dielectric constants of any material as well.

$$\varepsilon=\varepsilon_r'-j\varepsilon_r'' \tag{14}$$

It is also helpful to remember, $$\varepsilon=\varepsilon_r' \text{ and } \sigma=\omega\varepsilon_r'' \tag{15}$$

One can analyze the loss mechanism by solving the Helmholtz wave equation including complex dielectric or magnetic permeability as given in (12) or (13). The solution under "good conductor" approximation, which is defined as, $$\frac{\sigma}{\omega\varepsilon}\gg 1 \tag{16}$$

leads to the definition of the well-known "skin effect" written in terms of conductivity σ, magnetic permeability μ, and angular frequency ω given by $$.\delta=\sqrt{\frac{2}{\sigma\mu\omega}} \tag{17}$$

Where angular frequency ω is, $$\omega=2\pi f \tag{18}$$

The consequence of the solution of the wave equations is the current density, electric field, and magnetic fields in a "good" magnetic material or a "good" conductor material is confined to the surfaces of the material defined by the skin depth δ given as in (17). A reasonable approximation for current density, magnetic and electric fields in the interior of magnetic materials or good conductors can be given as $$E(u),\ H(u),\ J(u)\approx Ae^{-\frac{u}{\delta}} \tag{19}$$

Where u is the depth from the surface of the magnetic material or good conductor. For reducing the eddy current loss, magnetic cores are made with thin laminated magnetic material insulated by non-conductive and non-magnetic materials, as shown in FIG. 14.

Using laminated magnetic core as shown in FIG. 14 is a good practice for reducing the eddy current loss, which is a standard technique in transformers, electric motors, relays and any electrical machinery.

The eddy current power $P_{EC}$ for lamination thickness t which is less than skin depth δ with some very basic approximations for sinusoidal excitation can be written as, $$P_{EC}=\frac{wLt^3\omega^2B^2}{24\rho_{core}} \tag{20}$$

This will give "specific eddy current loss" $P_{EC,SP}$ which is the power loss per unit volume as, $$P_{EC,SP}=\frac{t^2\omega^2B^2}{24\rho_{core}} \tag{21}$$

Where $\rho_{core}$ is the magnetic core resistivity which is the inverse of the conductivity σ.

The advantage of using Ferrite cores in higher frequency magnetic applications comes from the much higher $\rho_{core}$ term in (20) and (21) compared to the traditional magnetic materials even though they have much lower magnetic permeabilities as seen in Table 1.

The importance of the lamination thickness t in the eddy current loss mechanism in the magnetic core and their frequency dependencies are clearly seen in relations (20) and (21). This formulation summarizes the main motivation for developing the process used in this invention which achieves very thin lamination along with very thin electrical insulation between laminations compared to anything reported earlier. In a traditional transformer, the lamination and insulation thicknesses t are typically in the order of 0.3 mm (300 microns) with electrical isolation thickness between laminations following the rule of $$s = 0.05 \cdot t \tag{22}$$

Giving typically in the order of 15 microns. This rule results in stacking factors in the order of 0.9 to 0.95, which is an important factor to keep as close as possible to 1. In the cores targeted by the present invention, lamination thicknesses are in the range of 3 to 40 microns with isolation thicknesses of 50 to 200 nanometers, (1 nm=$10^{-9}$ meter or $10^{-3}$ micron) giving an even better stacking factor compared to traditional magnetic steel-based laminations.

Another loss mechanism in magnetic materials is hysteresis loss, which is also related to the B(H) characteristics of the magnetic material. The area inside the B-H loop represents the work done on the material by the applied field and specific loss can be given as $$P_{H,SP} = kf^{a}B_{AC}^{d} \tag{23}$$

As an example, for the ferrite material 3F3 is, $$P_{H,SP} = 1.5 \cdot 10^{-6} f^{1.3} B_{AC}^{2.5} \tag{24}$$

In mW/$cm^3$, where f is in kHz and $B_{AC}$ in mT (milliTesla)

To achieve a core capable of practically handling both high and low currents, a total change in the inductance over current plot would have to be achieved. Given the complex equations describing the interactions of current and magnetic flux in miniature inductors, the air-gap geometry for the structures in the interest of this invention is best suited for an accurate numerical analysis employing Finite Element analysis or a similar method using an in-house field simulator or any commercially available Finite Element Method field simulation programs including Maxwell, HFSS, COMSOL, ANYSIS, and the like. To be useful in the industry, any such core should be cheap to create, approximately equal to, or even lower than, the cost of most cores today.

The following U.S. patents are incorporated by reference in full

U.S. Pat. No. 9,287,030B2 Multi gap inductor core Invented by Franc Zajc

U.S. Pat. No. 6,657,528B1 Slope gap inductor for line harmonic current reduction Invented by Allen Tang US20100085138A1 Crossed gap ferrite cores Invented by David Vail U.S. Pat. No. 9,093,212B1 Stacked step gap core devices and methods Invented by Deborah Pinkerton and Donald Folker The following United States Patents and Published Patent Applications are incorporated by reference in full:

US 20220068542 A1 Automotive variable voltage converter with inductor having diagonal air gap invented by Baoming Ge, Lihua Chen, and Serdar Hakki Yonak WO 2012079826 A1 Thin film inductor with integrated gaps Herget Philipp, Fontana Jr Robert Edward, Webb Bucknell, and Gallagher William U.S. Pat. No. 5,609,946 A High frequency, high density, low profile, magnetic circuit components invented by Korman Charles S, Jacobs Israel S, Mallick John A, and Roshen Waseem A US 2004/0158801 A1 Method of manufacturing an inductor invented by Leisten Joe, Lees Brian, and Dodds Stuart US 2011/0199174 A1 Inductor Core Shaping Near an Air Gap invented by Carsten Bruce W U.S. Pat. No. 4,047,138 A Power inductor and transformer with low acoustic noise air gap invented by Steigerwald Robert L U.S. Pat. No. 7,573,362 B2 High current, multiple air gap, conduction cooled, stacked lamination inductor invented by Clifford G. Thiel, Darin Driessen, Debabrata Pal, and Frank Feng The following Research papers are incorporated by reference Guo, Xuan, Li Ran, and Peter Tavner. "Lessening gap loss concentration problems in nanocrystalline cores by alloy gap replacement." *The Journal of Engineering* 2022.4 (2022): 411-421.

Liao, Hsuan, and Jiann-Fuh Chen. "Design process of high-frequency inductor with multiple air-gaps in the dimensional limitation." *The Journal of Engineering* 2022.1 (2022): 16-33.

O. E. Akcasu, K. Yakabu and J. L. Bouknight, "Statistical Characterization, Optimization and Design of Semiconductor Processes Using Computer Generated Data-Bases Created by Mathematical Process and Device Simulators", IEEE ICCAD 1985, November 1985, Santa Clara, Calif.

The following books are incorporated by reference in full

"Engineering Electromagnetic Fields and Waves," Carl T. A. Johnk, John Willey & Sons, Copyright 1975, ISBN 0-471-44289-5.

"Elements of Electromagnetics," Matthew N. O. Sadiku, Oxford University Press, Copyright 2001 Third Edition, 2001, ISBN 0-19-513477-X.

"Power Electronics," N. Mohan, Tore M. Undeland and William P. Robbins, Third Edition, Copyright 2003, John Willey and Sons, Inc., ISBN 978-0-471-22693-2

Where a reference defines a term or object differently than the specification of this patent application the application shall control the definition.

BRIEF SUMMARY OF THE INVENTION

The present invention comprises a specially designed means of air gap optimization for magnetically permeable material used in electrical components, for example, inductors and transformers. First, an inductance over current curve is selected, and an air gap cut start point, endpoint, start angle, and end angle for each cut of an air gap are selected within the core or along the core edges. Given the ideal curve, which is defined here as the user-selected curve, and the starting conditions, an air gap is calculated and simulated to meets or come as close as possible to the ideal curve selected. Multiple air gaps can be designed in a single core.

By utilizing partial air gaps, the traditional inductance over current curve, where an initial inductance is held until it nears saturation, at which point inductance suddenly drops, may be altered. This alteration results in a curve which provides an initial period of relatively flat inductance over an initial current range and a second period of relatively flat inductance over a second current range. In practice, this may be thought of as picking the first inductance for low currents and a second inductance for high currents. By adding multiple partial air gaps to a core, more periods of relatively flat inductance can be created.

Therefore, the method of the invention is to determine a desired $L_{TARGET}(I)$ curve (inductance over current curve) which is determined according to the intended application of the magnetic core. A given range of initial air gap conditions: start and end points, as well as start and end angles, are selected. Several possible cuts are determined, and the inductance over current curve of the air gap formed by these cuts is simulated. The cuts closest to the initially desired $L_{TARGET}(I)$ curve may be selected.

The optimization method of generating air-gap geometries given in this invention applies to any type of magnetic circuit. This invention addresses a methodology of generating "manufacturable" desired inductance L(I) function with a special emphasis on magnetic cores having laminated magnetic structures. Building miniature inductors with laminated magnetic cores has several advantages over ferrites and standard laminated inductors/transformers.

Building miniature inductors also allows customization of any type of air-gap generation with no additional step other than standard lithography employed already in the process, which is impossible to employ in any other prior art inductor/transformer manufacturing processes.

By working in lithography with miniature inductors, a wide array of air gap shapes can be made, and these air gaps have different properties. The inclusion of discrete partial air gaps in this system of multi-layer laminated cores produced by lithographic means enables the ideal inductance to current curves to be reached.

Partial air gaps can be used to redirect the magnetic flux lines in a core in a unique way. Partial air gaps give a user the ability to effectively separately set the saturation point of a core for high and low current or even to force the core to saturate at the same time. In a true partial air gap (a gap that does not completely transverse the core from a first core edge to a second core edge), the magnetic flux from the low-level current will not enter into and take upon itself the permeability of the air gap, but it will move around the partial air gap. However, under a high current application, the magnetic flux will utilize the air gaps, and the effective permeability of the core would decrease. Thus, at a higher current, more current is required to reach $B_{SAT}$ preventing the high current from easily saturating the core and dropping inductance.

Partial air gaps can be added to magnetic core components optimized for high-current applications such as high-current DC-to-DC converters. The high-current DC-to-DC converter will still be optimized for high current, but it will have the added function of meeting industry standards for low-current applications—giving it the ability to handle both high-current and low-current applications.

Although the general concept of partial airs for magnetic cores can be applied to ferrite, steel, and other forms of cores. It is particularly low cost to implement the air gaps in cores created by lithography and built layer by layer. Lithography allows for a variety of air gap angles, start/end points, and air gap pathways through a core.

Particular pathways calculated to provide or approach ideal curves include cores with partial air gaps of varying width, for example, those that start at the first edge of a magnetic core and extend directly towards the second edge of the magnetic core, narrowing as they get closer to the second edge of the core, but never reach the second edge of the core. The width of an air gap may expand or decrease along an airgap pathway which is the route along the core that an airgap takes.

The air gaps of the present invention may also have a uniform width. Although this allows for less tuning of the air gap to control reluctance throughout the core, it is still beneficial.

For reference, FIG. 15 shows the inner side 1501 and outer side 1502 of the toroidal core 1500. While FIG. 16 shows the inner sides 1601 and outer side 1602 of a hybrid core 1600. The principle of an inner and outer side holds true across core types. When a first edge is mentioned, it may mean the inside or outside edge of a core, and when a second edge is mentioned, it will mean the edge which differs from the first edge. Some air gaps may start and end on the same edge while some may not start or reach either edge.

The air gaps created by the present system need not be partial but may be full air gaps, and multiple air gaps per core may be used. However, it is the inclusion of partial air gaps that allow for the target inductance over current curves to be reached but given applications may benefit from a full air gap depending on the lower threshold for current.

The spacing between multiple air gaps is typically optimized when the air gaps on a single layer are evenly spaced. In multi-layer cores, layers bearing a partial air gap may have the air gap of each layer offset from the air gaps of other layers to prevent eddy current formation and interference from fringing magnetic flux.

The airgap's physical parameters in this present invention are calculated by many factors, and these factors include total inductance, effective $B_{SAT}$ desired, manufacturing tolerances, uniformity of thermal performance, and the distance not only across the air gap on the same layer but the distance from one air gap to the adjacent layers due to fringe which may cause magnetic flux lines to jump layers.

DETAILED DESCRIPTION OF THE INVENTION

The present invention comprises a specially designed means of air gap optimization for magnetically permeable material used in electrical components, for example, inductors and transformers. The air gap is optimized according to an altered inductance over current curve.

An altered inductance over current curve is one that presents a region of initial relatively flat inductance at an initial range current range and at least one additional region of relatively flat inductance over an additional current range. When an altered inductance range is selected by a creator or a user of the method, the altered inductance over current curve will be referred to as an ideal inductance over current curve. The ideal curve can be selected based upon the principals discussed below. The target curve may be selected by simply choosing a first inductance for a lower current range and a high inductance for a higher current range given these principles.

Figure 17:
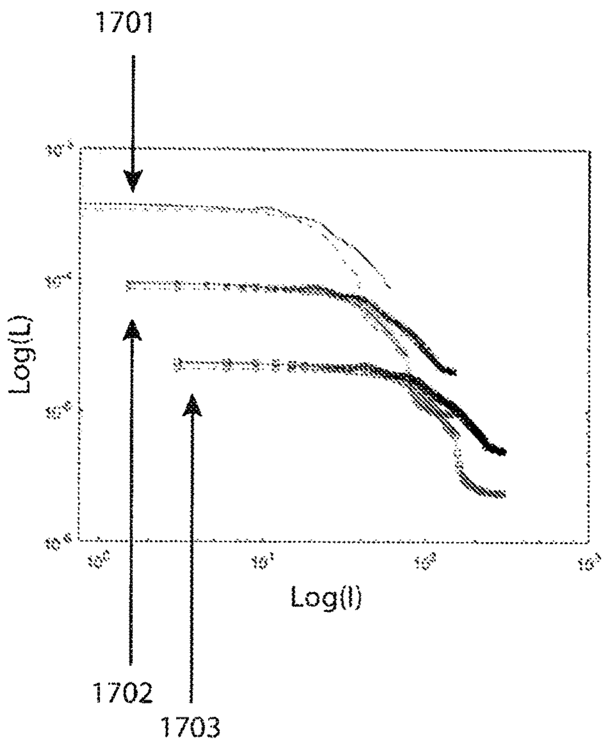
FIG. 17 shows three L over I curves on a log scale as general examples of what can be achieved by this invention.

FIG. 17 shows three examples of general curves produced by this invention. These are the typical (i) for two air gap widths and 3 different number of coil turns. the first line pairing 1701 is for $n_1$ number of turns, the second line pairing 1702 is for $n_2$ coil turns, and the third line pairing 1703 is for $n_3$ number of turns where $n_1>n_2>n_3$.

Figure 18:
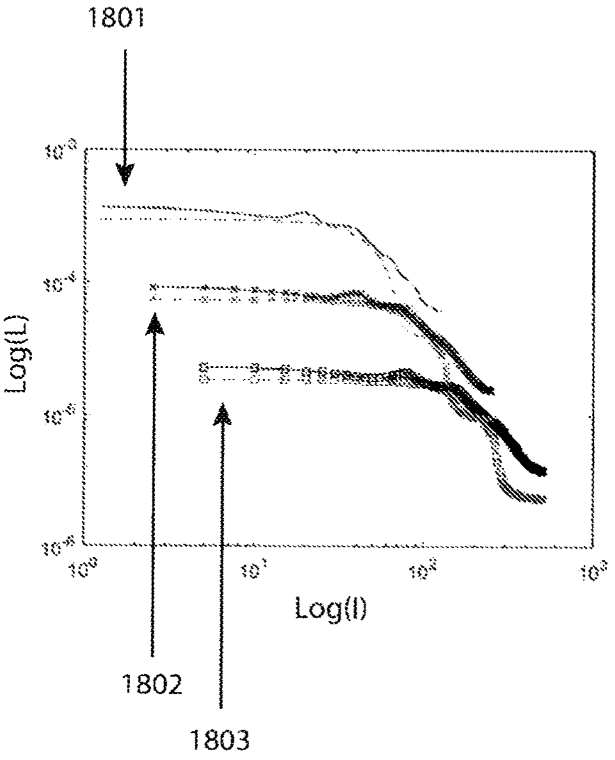
FIG. 18 shows three additional L over I curves on a log scale as general examples of what can be achieved by this invention.

FIG. 18 shows three more examples of general curves produced by this invention. These are the typical (i) for two air gap widths and 3 different number of coil turns. the first line pairing 1801 is for $n_1$ number of turns, the second line pairing 1802 is for $n_2$ coil turns, and the third line pairing 1803 is for $n_3$ number of turns where $n_1>n_2>n_3$.

FIG. 17 and FIG. 18 show a logarithmic curve and each of the line pairs 1701-1703 and 1801-1803 have some secondary curve outside of the general shape.

Figure 19:
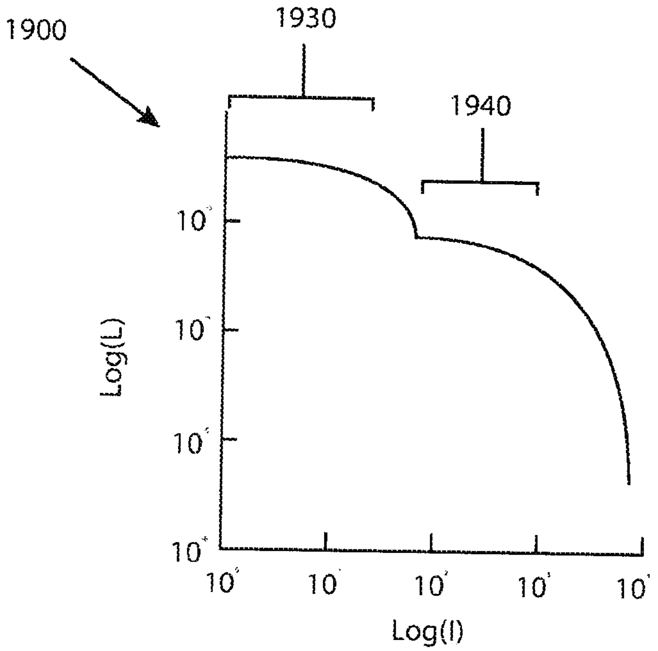
FIG. 19. shows an additional L over I curve on a logarithmic scale, but this time specifically being a generalization of a partial air gap.

A partial gap inclusion in the system will produce a very distinct first curving region 1930 and second curve region 1940 as generalized in graph 1900 in FIG. 19.

The inclusion of partial air gaps gives the magnetic core the ability to provide high inductance over a wide range of current frequency as it decreases the permeability of the core as current increases. A typical partial gap may present a sharp jump point in permeability, but a partial gap may be curved or varied to smooth the transition from low to high current. This enables the magnetic component to be used effectively at varying current levels.

The particular inductance levels of each curve depend on the permeability of the magnetic flux pathways utilized by the flux at a given current. As such, the ability to change the inductance over current curve is derived from the nature of the magnetic flux lines which occur in the core when the magnetic component is in use, as well as the reluctance of the core and air gap.

Figure 20:
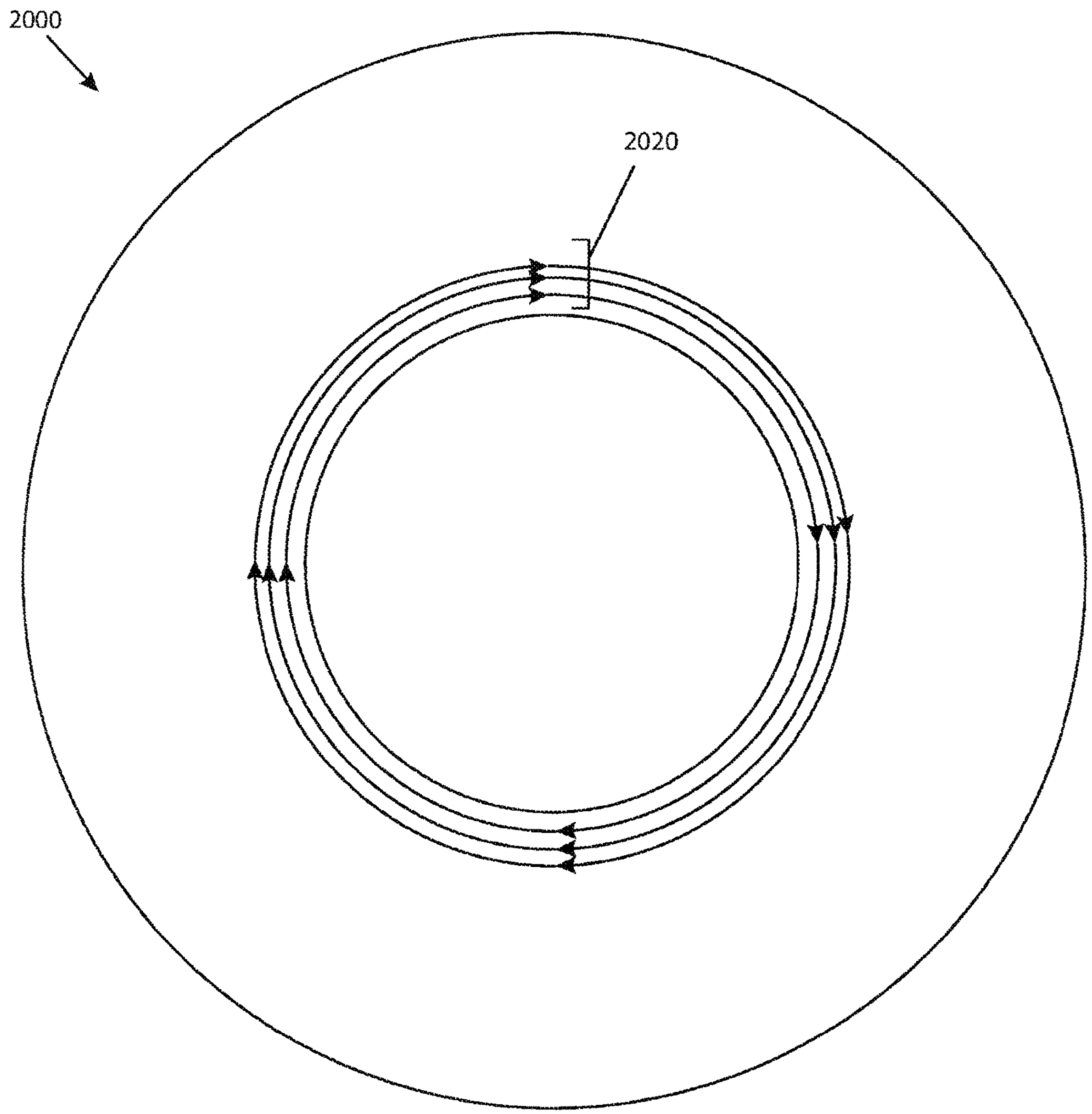
FIG. 20 is a top-down view that shows magnetic flux lines from a low initial current in an un-gapped magnetic core.

Magnetic flux lines take the path of least reluctance around the core. In a core with a single impedance value, this is the shortest path the magnetic flux lines can take around the core. FIG. 20 shows magnetic flux lines 2020 running along the interior edge of the core 2000, which is the shortest path for that core. The magnetic flux lines will limit themselves to the inner path until the amount of flux is increased, and that pathway becomes saturated—thus unable to hold more flux lines. As the inner pathways of flux become saturated, new flux lines will run farther away from the inner portion of the core. This pattern of saturation and repositioning will occur until a core is fully saturated.

Figure 21:
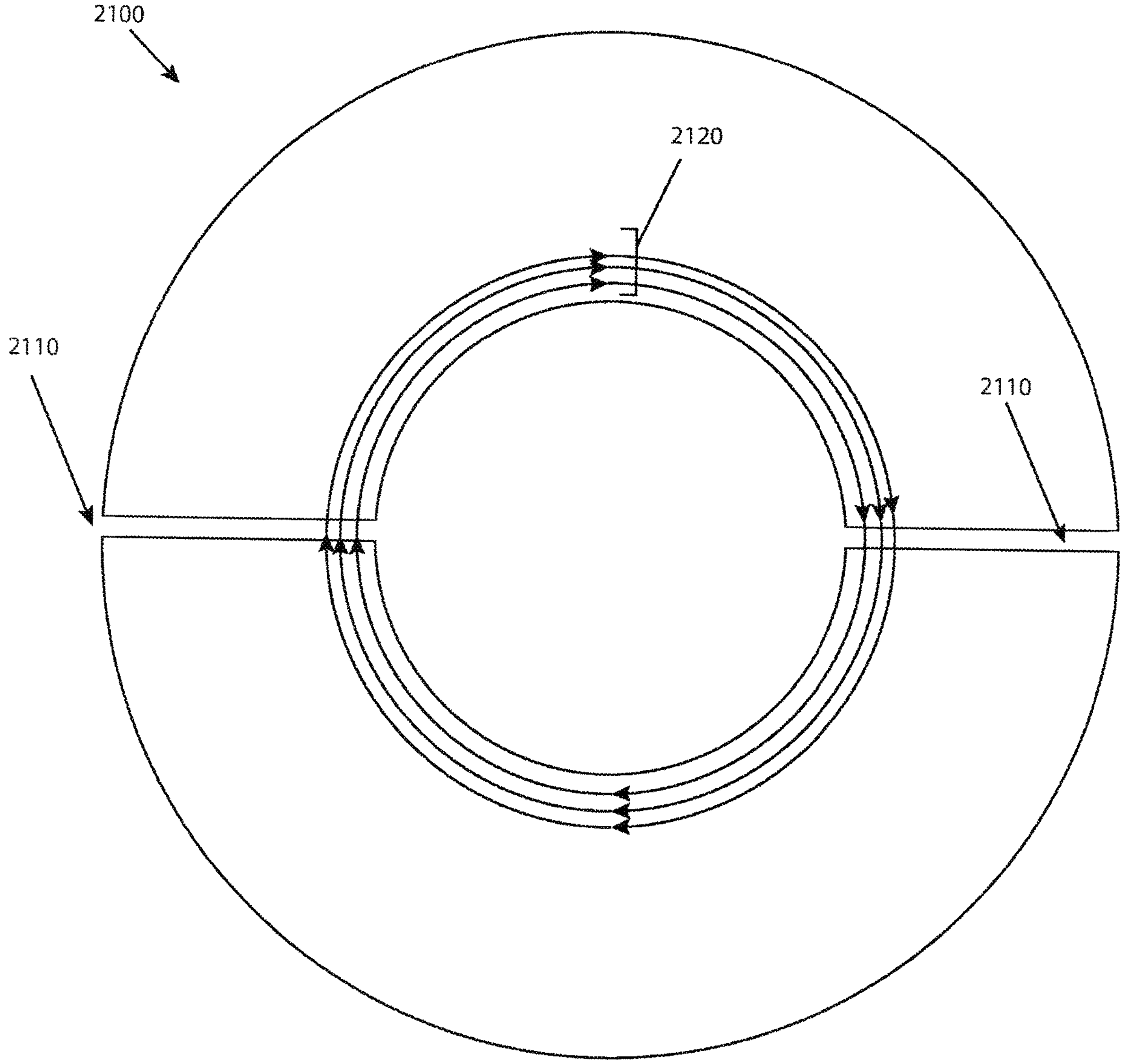
FIG. 21 is a top-down view that shows magnetic flux lines from a low initial current in a traditional air gapped core.

A straight full-width air gap or a powder core merely makes the core more impermeable to flux so that more current is required to generate flux in the core. It does not significantly change the pattern or path of the magnetic flux lines. FIG. 21 shows a magnetic core with straight full core width air gaps 2110 having magnetic flux lines 2120. These magnetic flux lines, although they took more current to generate them, are in the same position as the flux lines in an un-gapped inductor of the same shape, for example, the inductor core shown in FIG. 20.

In the presence of an air gap that has been formed from a first boundary edge, such as the outside edge, to a second boundary edge, such as the inside edge, the magnetic flux flowing in the core is forced to cross this airgap boundary no matter what, and thus, the effective impedance for all pathways of the air-gapped magnetic core becomes a combination of the air gap and the remaining magnetic core. However, in a partial air gap, at low currents, the magnetic flux lines can be made to pass around the air gap through the unsevered magnetic core material. This passing of the air-gapped core portion occurs because the air gap has a high reluctance in relation to the core material such that even a potentially longer pathway through the core material offers less impedance than crossing an air gap would.

Figure 22:
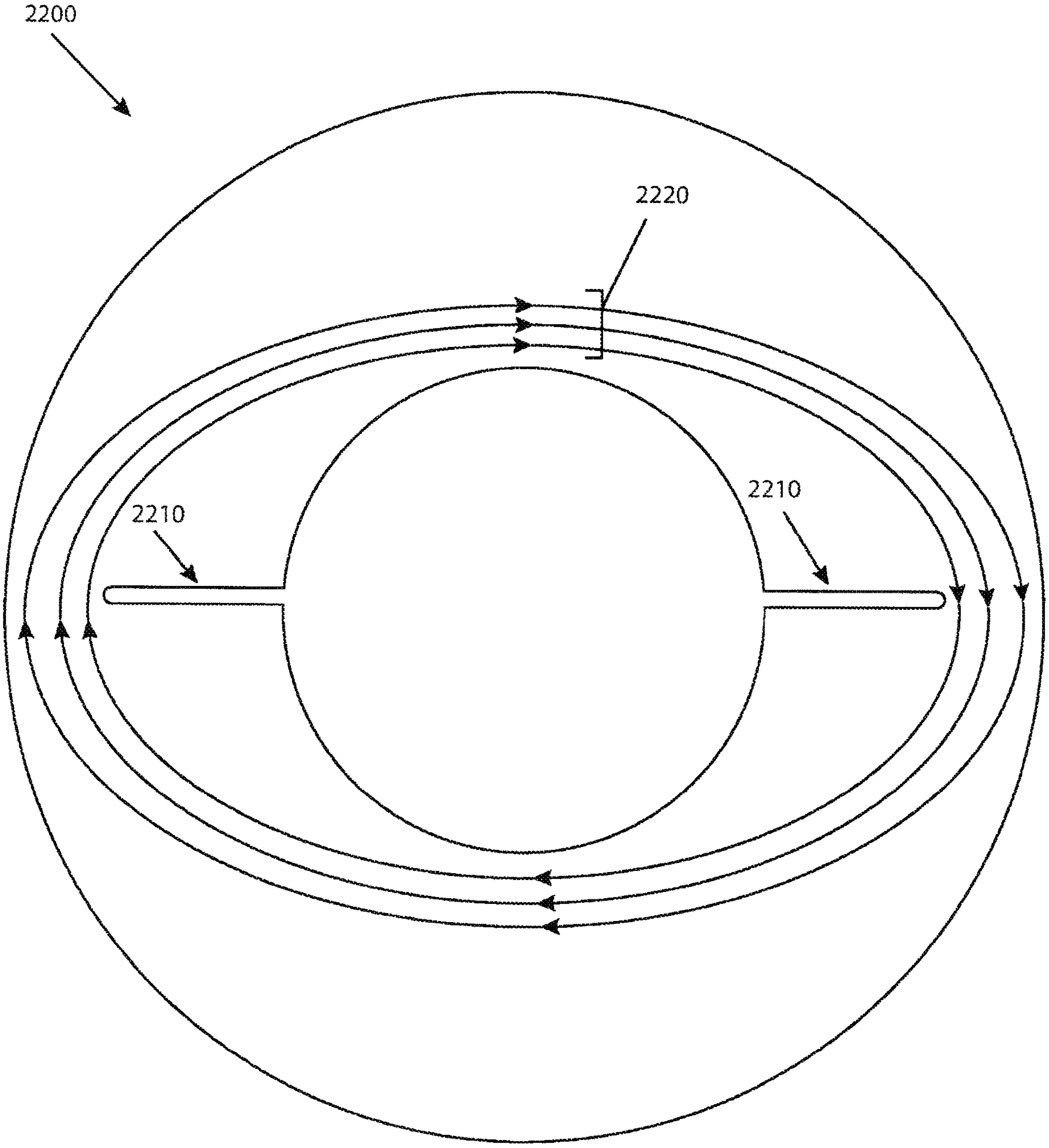
FIG. 22 is a top-down view that shows a magnetic core having two partial air gaps on the inside edge of the core with initial magnetic flux lines.

FIG. 22 shows a magnetic core having two partial air gaps 2210 starting on the inside edge of the core and partially traversing a core 2200 cross-section. Magnetic flux lines 2220 from an initial current flow in elliptical pathways around the partial air gaps 2210. The partial air gap can be set so that it proves great enough impedance so that it will only be utilized once the magnetic core material is saturated. Therefore, as current rises the core material passing around the air gap will start to become saturated, and once saturation is reached, magnetic flux lines will begin to utilize the air gap.

Figure 23:
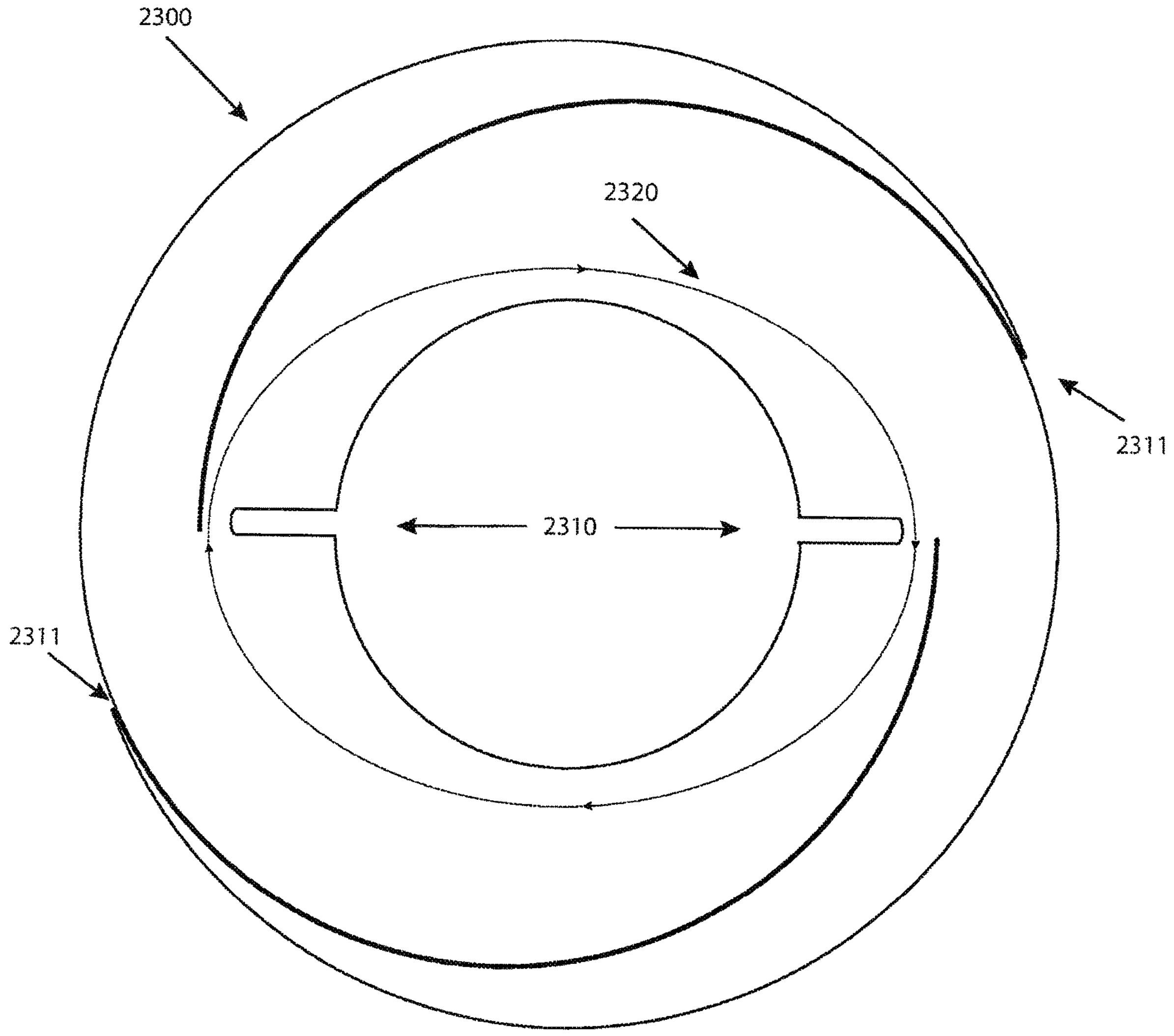
FIG. 23 is a top-down view that shows the initial pathway of magnetic flux lines through core with two straight partial inside edge air gaps and two partial spiral air gaps starting on the outside edge of the core.

By adding multiple air gaps to the core, the pathways of the magnetic flux can be significantly changed. FIG. 23 shows a magnetic core 2300 having two inside edge partial air gaps 2310 and two widening partial air gaps in a spiral shape 2311 starting from the outside edge of the core 2300. These partial air gaps 2310 and 2311 do not intersect here but leave a space between each other. This space is filled with the initial magnetic flux lines 2320.

Figure 24:
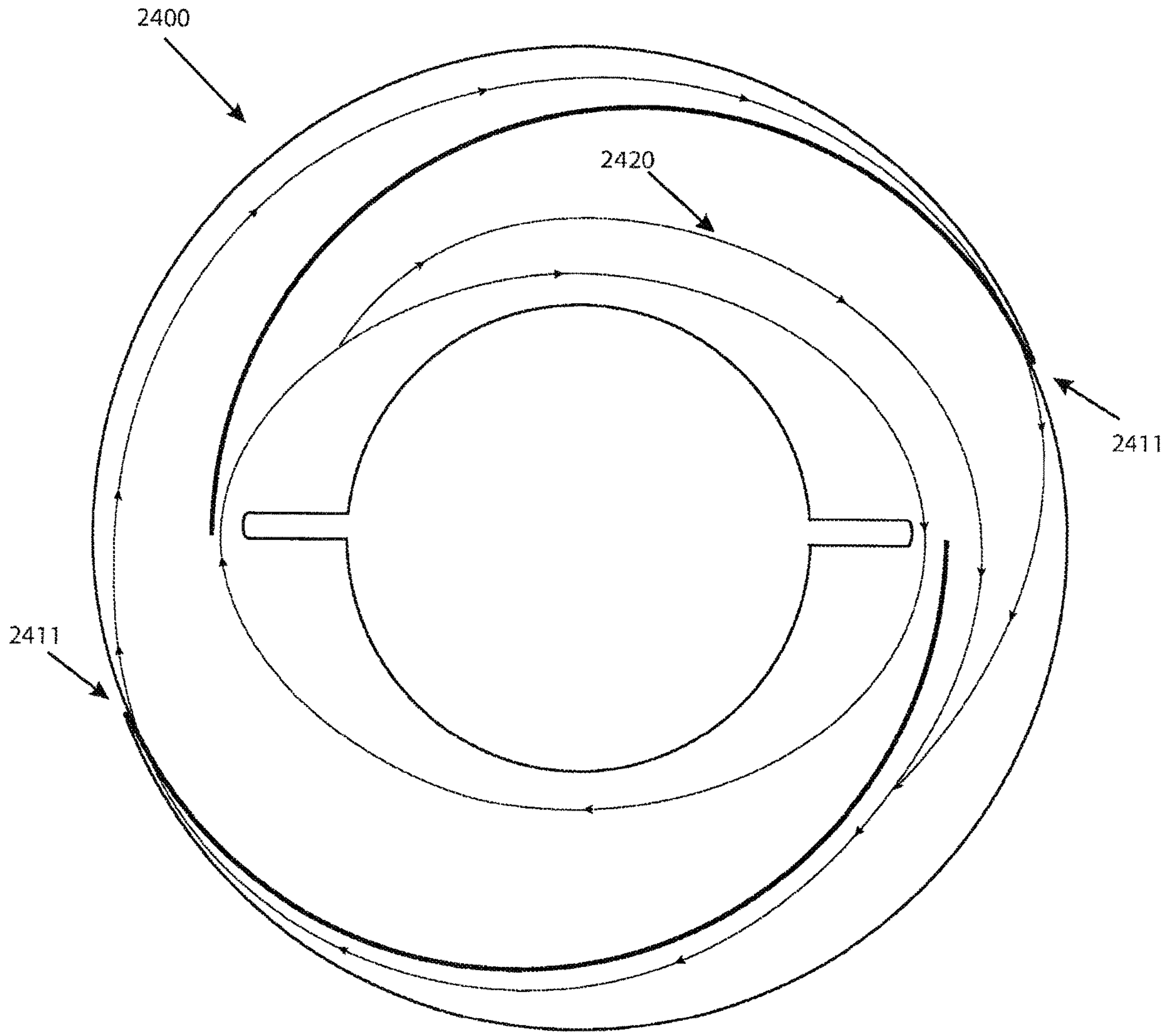
FIG. 24 is a top-down view that shows the pathway of magnetic flux lines through core of FIG. 23 as current begins to increase.

FIG. 24 shows the same core as in FIG. 23, but under higher current, so that magnetic flux lines 2420 are forced to the outside edge of the magnetic core 2400 by widening partial spiral air gap 2411 where the partial spiral air gap is wider towards the inside edge. This has the benefit of providing an un-gapped pathway for the initial current, an air gap for slightly higher current, and a stronger air gap (the straight partial air gap) for high currents.

Balancing the air gap dimensions with impedance values for magnetic flux pathways of the core allows for scaling of current and inductance in a single magnetic component—enabling it to be used effectively at varying current levels. Therefore, for instance, a single inductor could be used in low and high-current applications Partial air gaps enable a simple method of altering magnetic flux pathways around the core so that a core can be applied to high and low-current-level applications. As full air gaps require that the base current level increases to start generating magnetic flux, it is not ideal for low current applications. However, a partial gap will remove that barrier to initial current as well as provide a separate higher impedance pathway to allow for high current applications while remaining under the $B_{SAT}$ level.

There are two categories of partial air gaps: straight and curved and each has a different way of directing magnetic flux and affecting other core properties.

The first category of the magnetic core air gap is the straight partial gap. This partial gap will block a portion of the magnetic core from flux generated by low-frequency current. The partial straight curves can be placed along an edge of a core and will cut towards the remaining edge. Partial straight curves tend to act like a wall by eliminating pathways for magnetic flux at low currents. However, partial straight cores may be placed anywhere in core and in any direction in the core.

Figure 25:
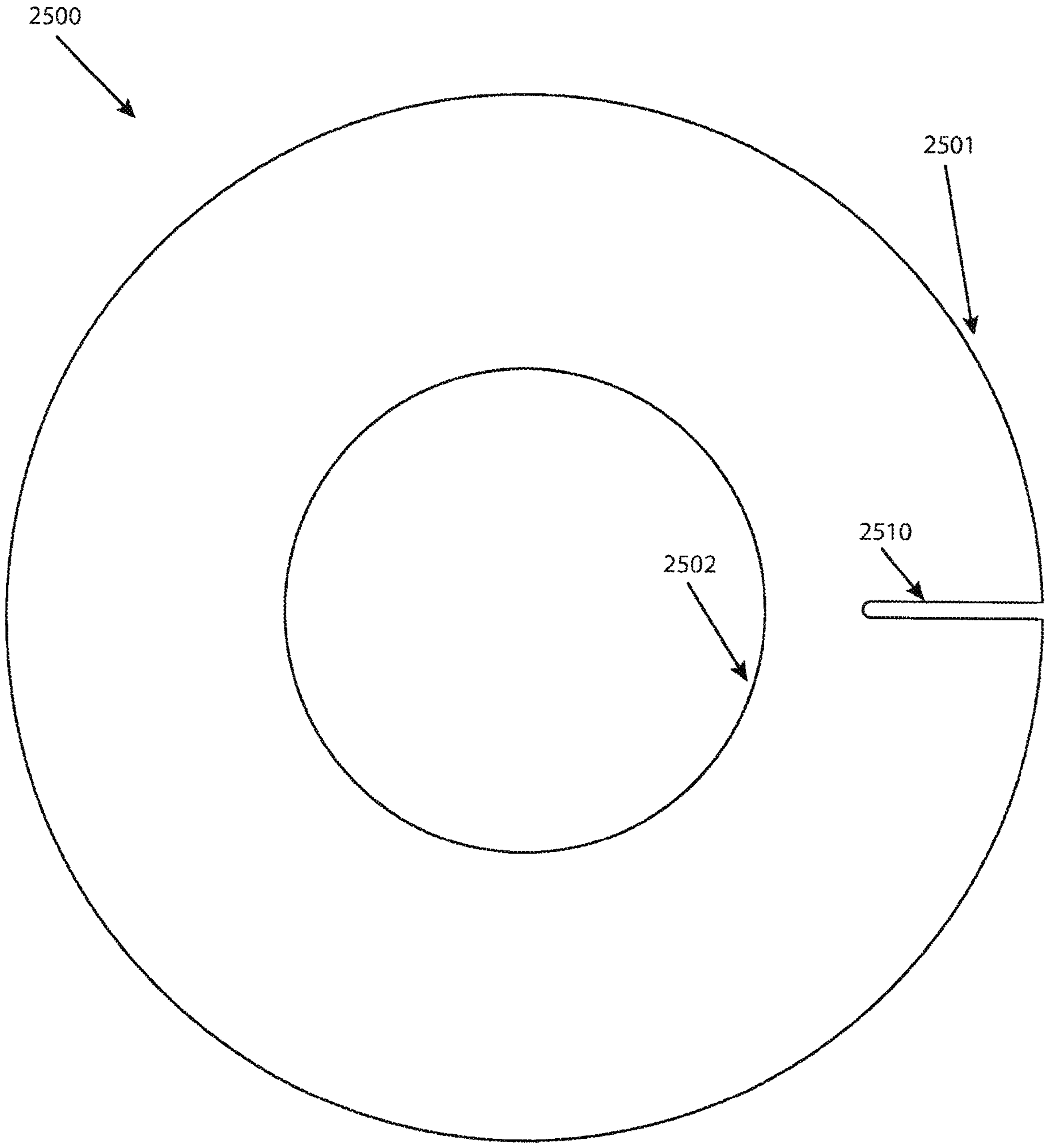
FIG. 25 is a top-down view that shows a magnetic core with a partial air gap starting at an outside edge of the core.

FIG. 25 shows an inductor core 2500 having a straight partial air gap 2510 across a partial cross-section of a magnetic core 2500. The air gap 2510 is shown coming from the outer edge 2501 of the core 2500, traversing the cross-section of core 2500 in the direction of the inner edge 2502. The position of the partial air gap will determine the properties of the core. The air gap may be placed at any point along the outer edge 2501 of the core 2500 to create an inductor that maximizes inductance at light loads.

Here there is no manipulation or increase in impedance for the initial magnetic flux lines, which will travel around the magnetic core without crossing the air gap, as the air gap is not over the shortest path around the core.

Figure 26:
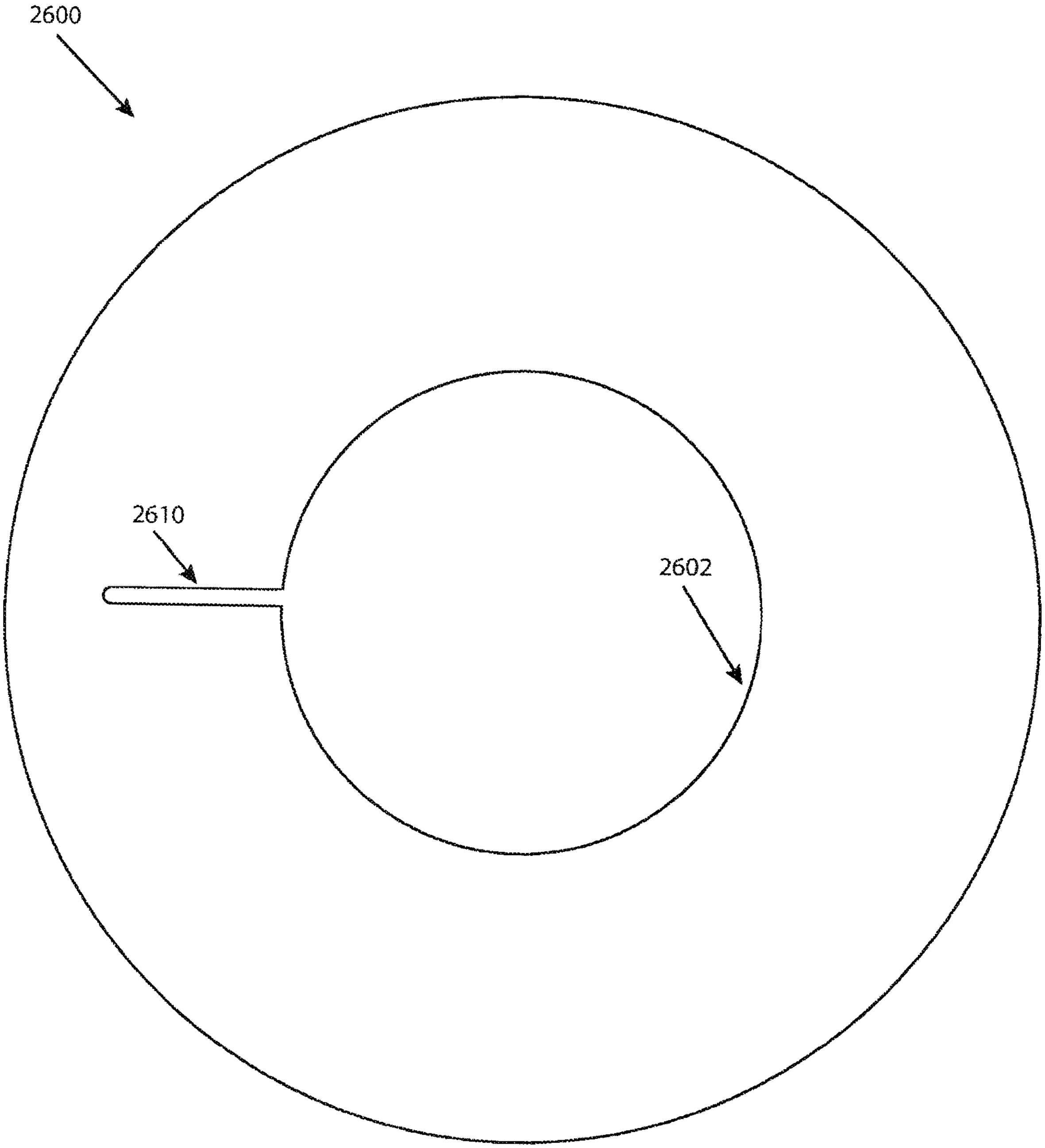
FIG. 26 is a top-down view of a magnetic core having a partial air gap that transverses the core from the inner edge towards the outer edge, but does not reach the outer edge.

However, as noted above, partial air gap is not limited to an outer edge but may be effectively applied to any edge of a magnetic core. If the air gap is placed along the inner edge, as shown in FIG. 26, where the magnetic 2600 has a partial air gap 2610 starting from the inner edge 2602, it will instead reduce light load inductance. This occurs as shown as the air gap is now over the shortest possible path around the core, which forces the magnetic flux lines to take a longer path around the core, slightly raising the impedance of the path they take. This reduction of light load inductance may be useful in some applications where even light loads cause the $B_{SAT}$ limit to be reached.

Figure 27:
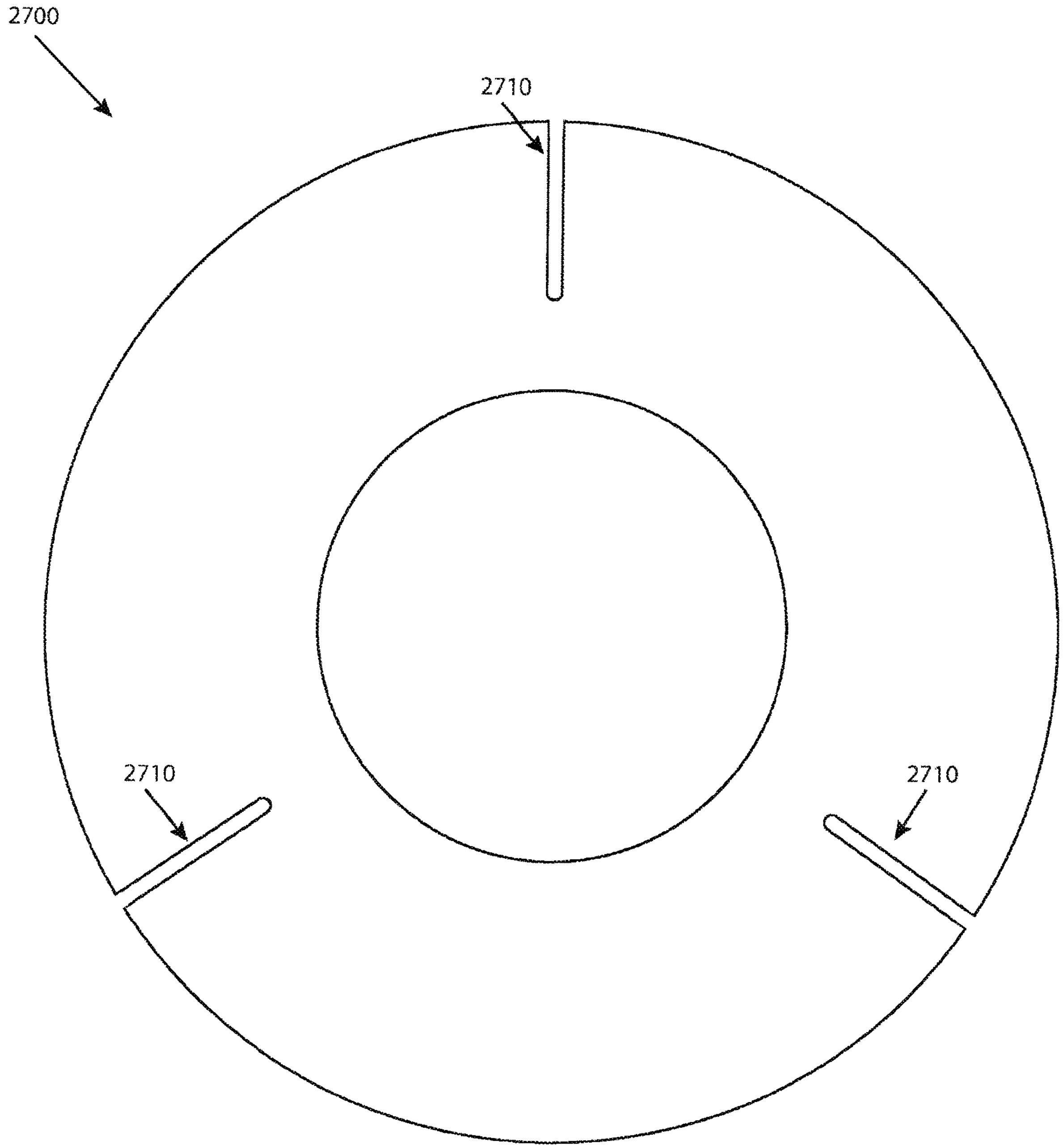
FIG. 27 is a top-down view of a magnetic core having multiple partial air gaps, which are evenly spaced according to the shape of the core.

Multiple straight partial air gaps can be added to a core. FIG. 27 shows a magnetic core layer 2700 having multiple partial air gaps 2710. Here there are three partial air gaps, 2710, which are evenly spaced apart in the magnetic core 2700. However, the air gaps need not be spaced evenly around the magnetic core. Nor do air gaps need to all occur on the same layer of the core.

Increasing the number of air gaps along a pathway for magnetic flux lines increases the reluctance over that pathway. Any combination of partial air gaps may be procured according to the intended purpose of the core, and such combinations may include full air gaps in conjunction with partial air gaps.

The second category of air gaps is curved partial gaps. Curved partial gaps may present a significantly longer gap width for portions of the gap.

Figure 28:
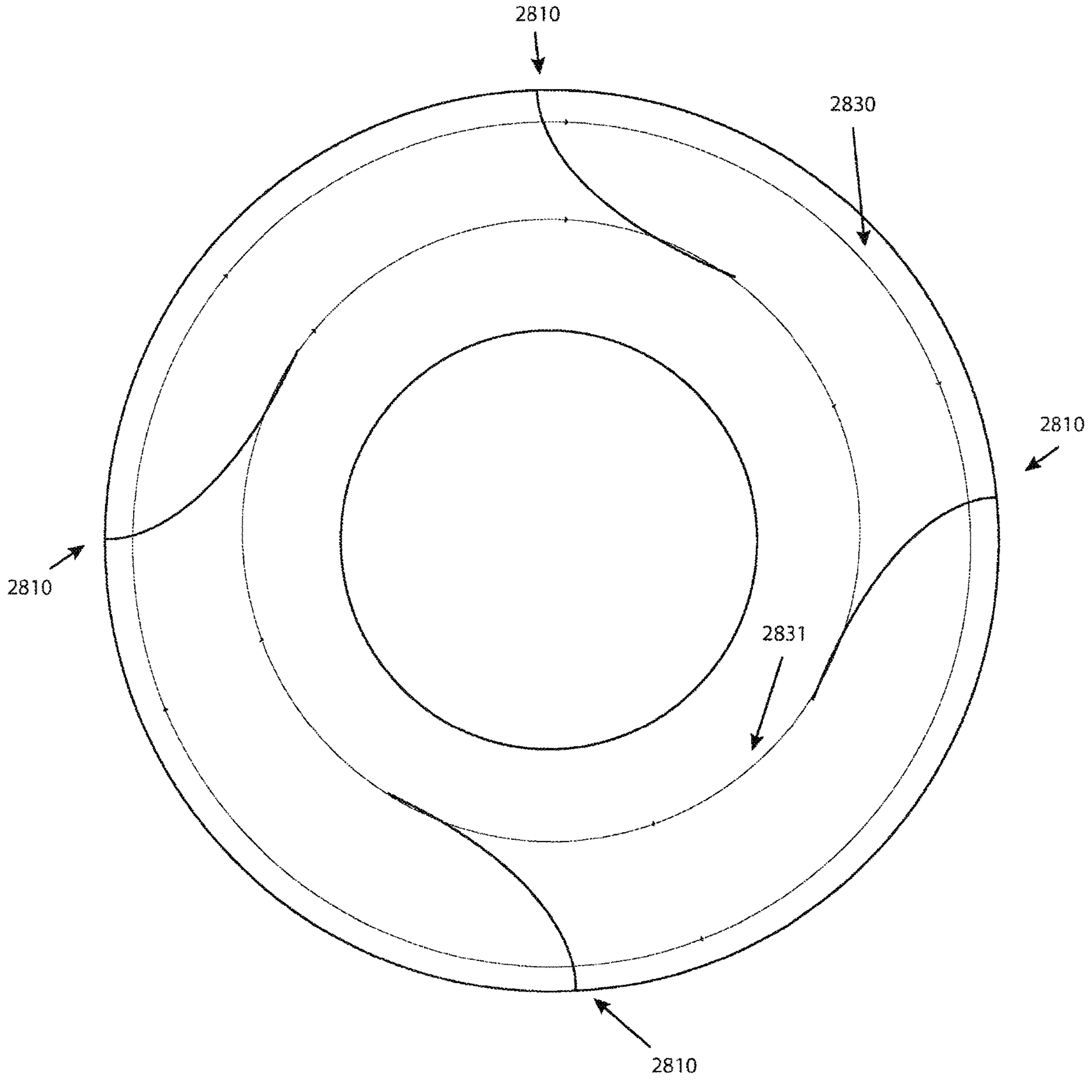
FIG. 28 is a top-down view of a magnetic core having four partial curved air gaps starting on an outside edge with two magnetic flux pathways highlighted.

If the gap curves align with the pathway of the magnetic flux, the width of the gap that the magnetic flux lines along that path would need to cross would increase, and thus the impedance of that pathway increases. Curved pathways present a more nuanced method of creating a gap cross-section than simply varying the width of a straight pathway. FIG. 28 shows two magnetic flux pathways 2830 and 2831, respectively, passing over curved air gaps 2810. As the air gaps 2810 curve to follow the natural flow of flux, they present higher impedance due to an increased pathway over an air gap than magnetic flux following a pathway over the portion of the curved air gaps 2810 perpendicular or near perpendicular to the magnetic flux pathway. So, flux pathway 2830 faces a higher impedance than magnetic flux pathway 2831. This fact can be used to pull magnetic flux towards an edge of a core by increasing the impedance of the middle of the core. An optimum distance for partial spiral air gap is less than 90 degrees from the in angle to the out angle on a coordinate system.

The gaps of these two categories can be modified by varying the width and gap cross-sectional style. Therefore, for instance, a straight partial gap may have a varying width and a diagonal cross-section.

Figure 1:
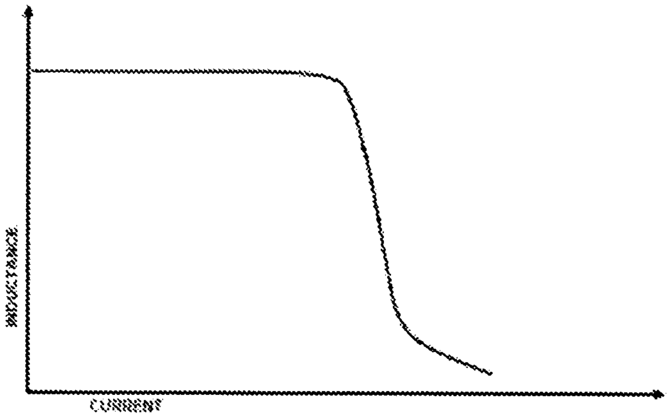
FIG. 1 is a graph of inductance over magnetic intensity showing a steep drop in inductance once the saturation point is reached.
Figure 2:
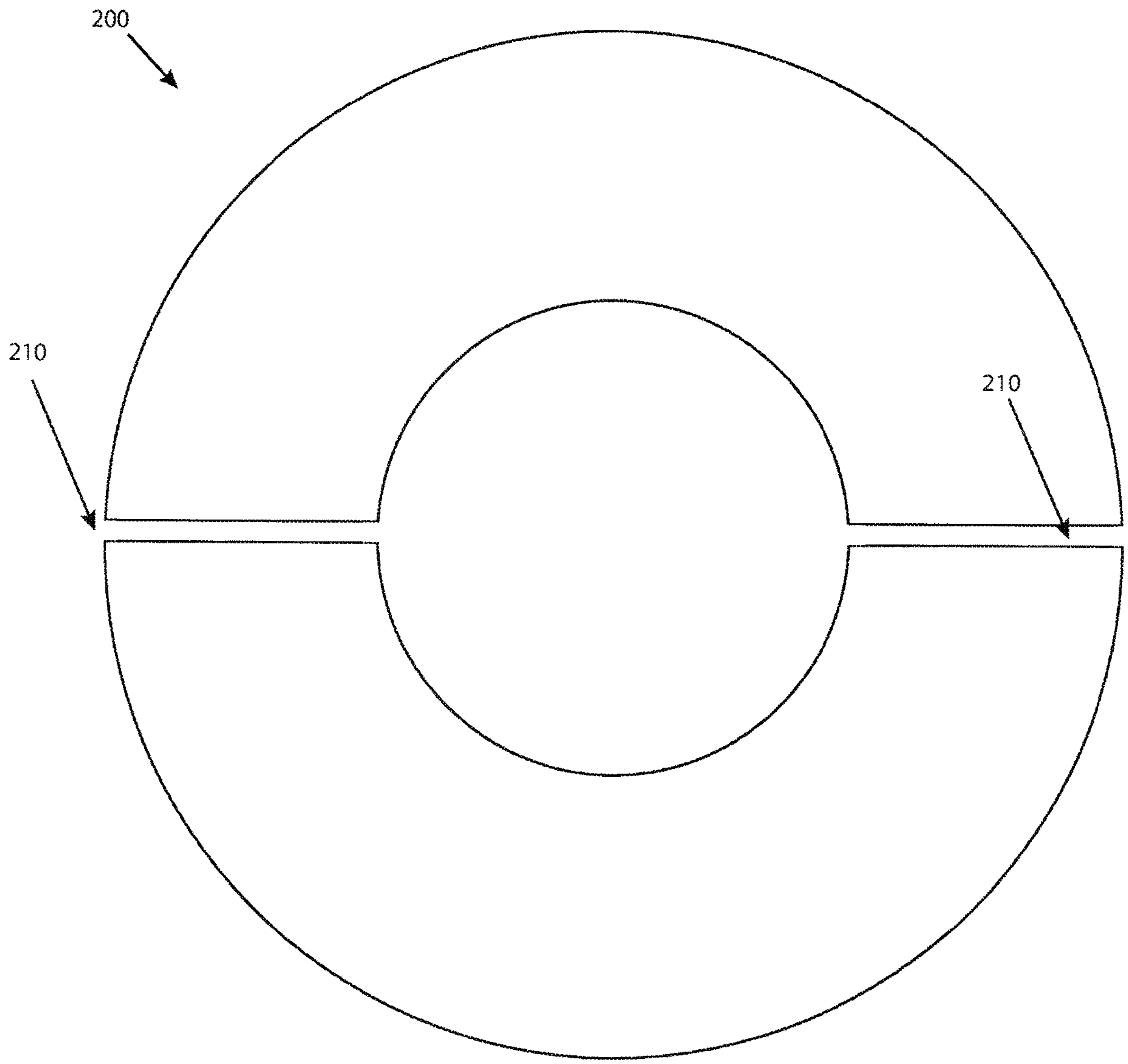
FIG. 2 is a top-down view of a magnetic core having a traditional air gap traversing the entire width of the core.
Figure 3:
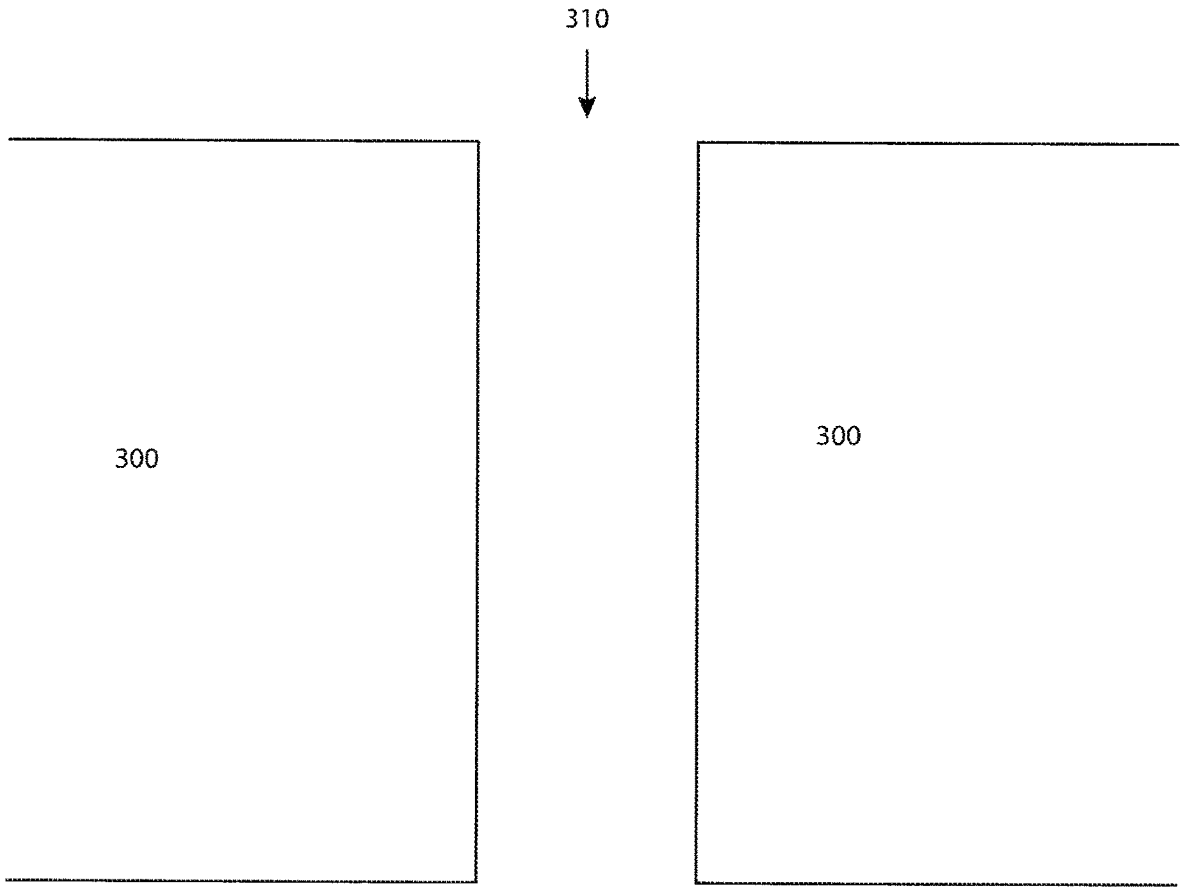
FIG. 3 is a side view of an air gap having a vertical cross-section.
Figure 4:
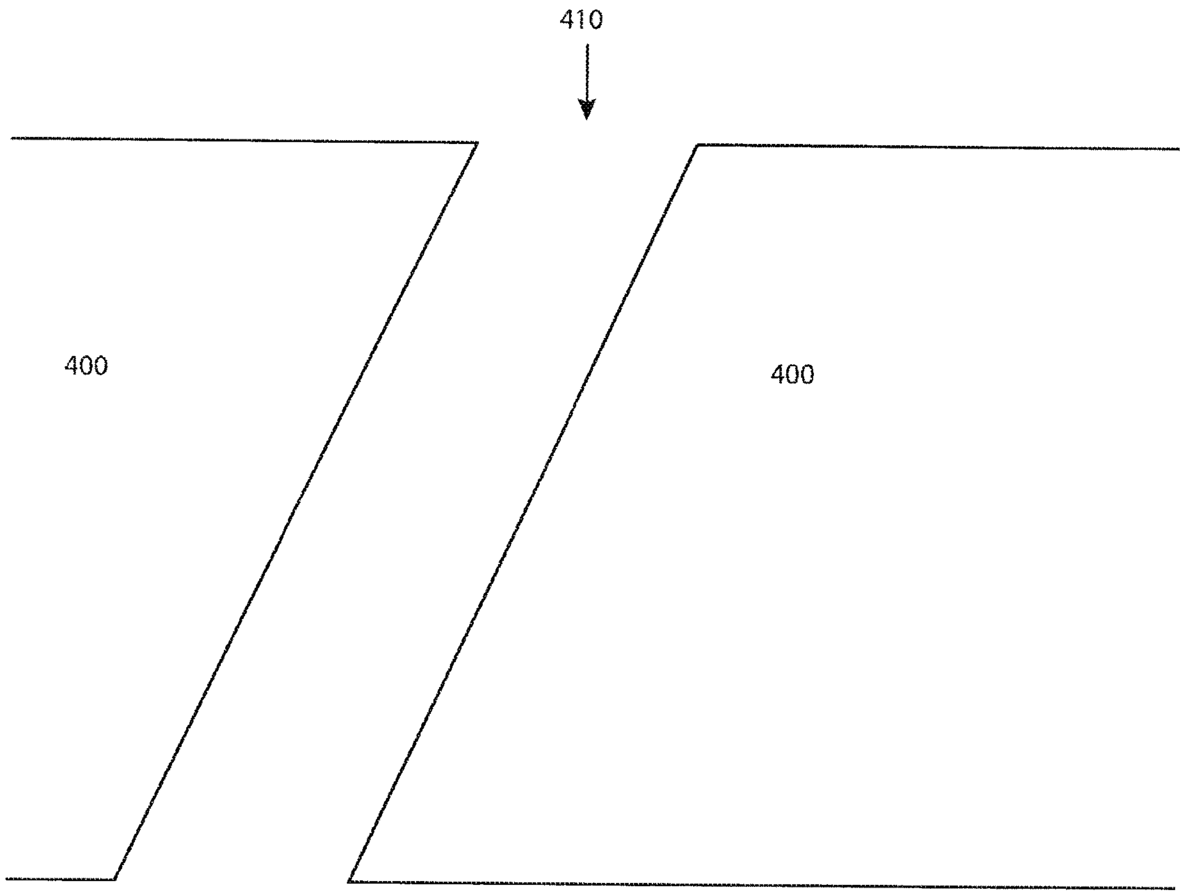
FIG. 4 is a side view of an air gap having a diagonal cross-section.
Figure 5:
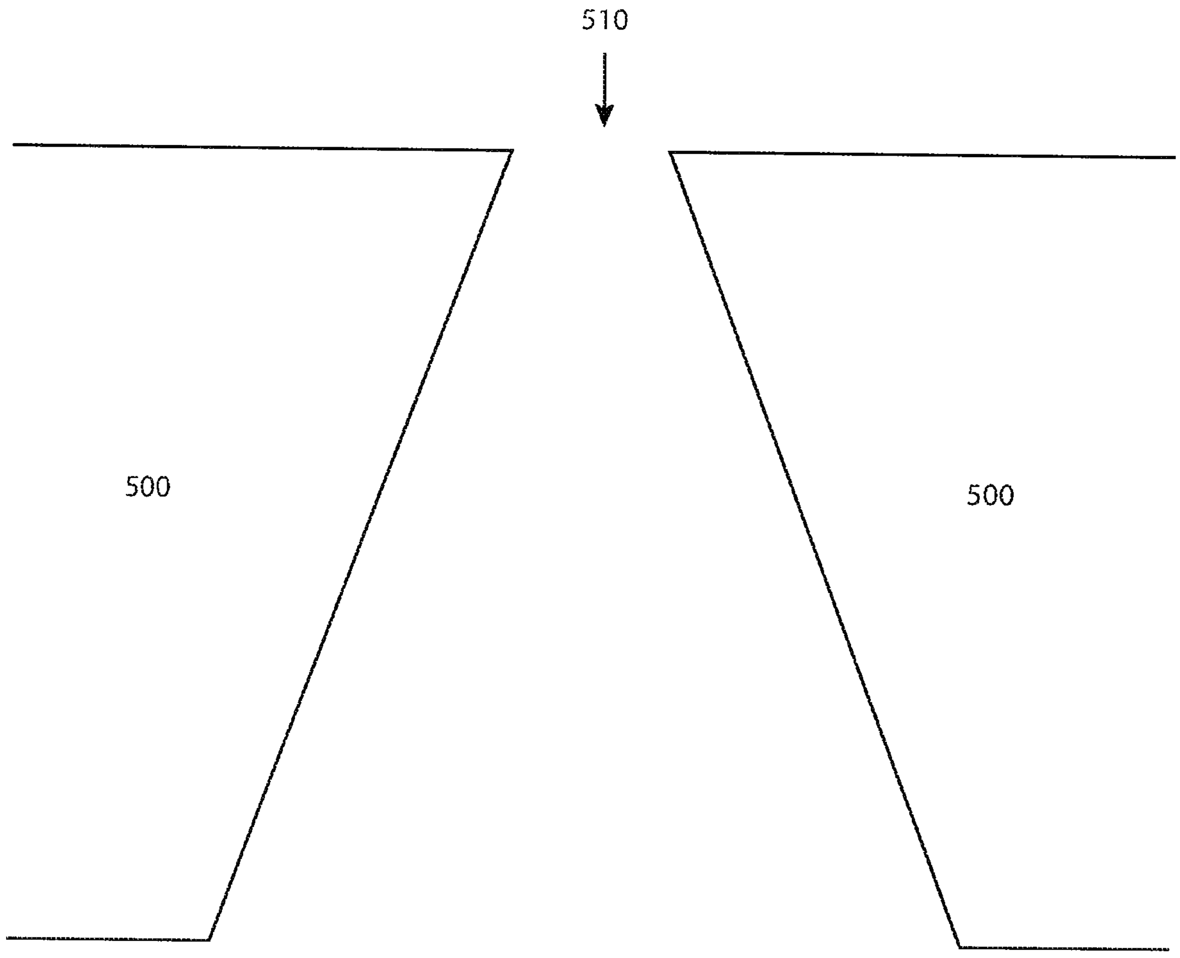
FIG. 5 is a side view of an air gap having a vertical varying width cross-section.
Figure 6:
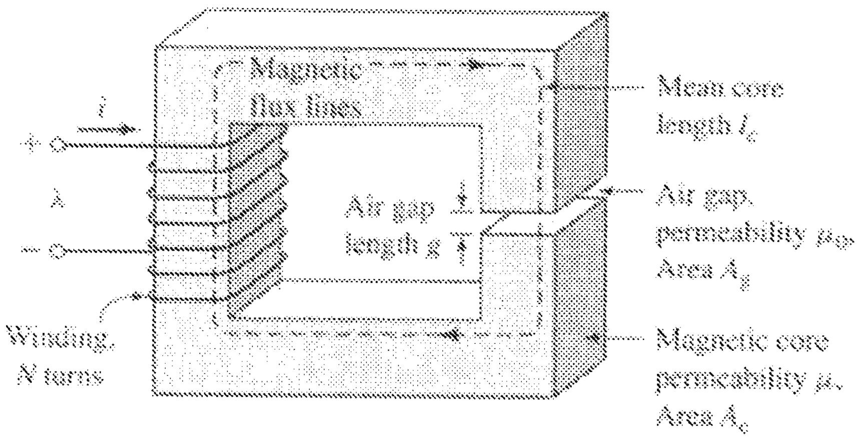
FIG. 6 is a classic magnetic core with air gap for an early inductor.
Figure 7:
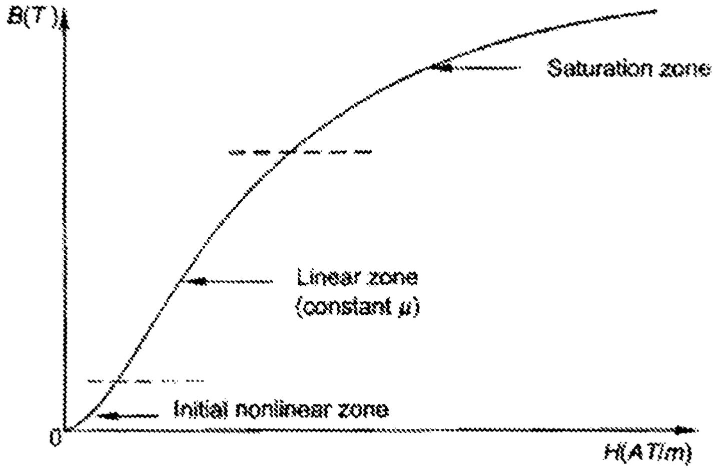
FIG. 7 is a B-H curve for magnetic flux in general in magnetic cores.
Figure 8:
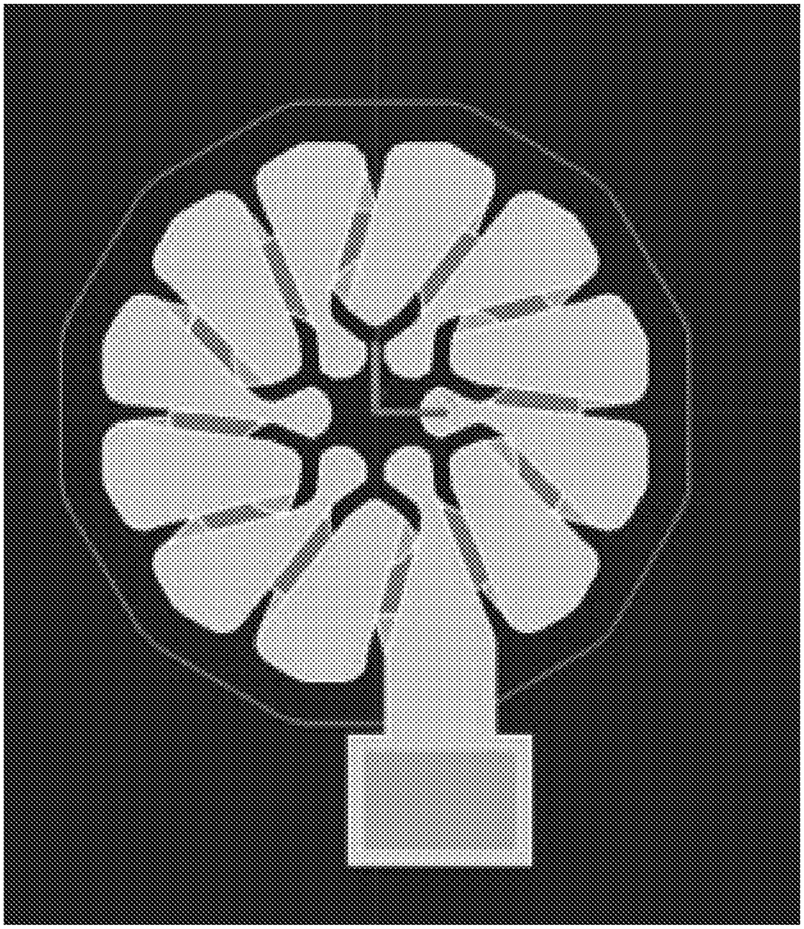
FIG. 8 is a top-down view of a laminated miniature inductor having 12 turns.
Figure 9:
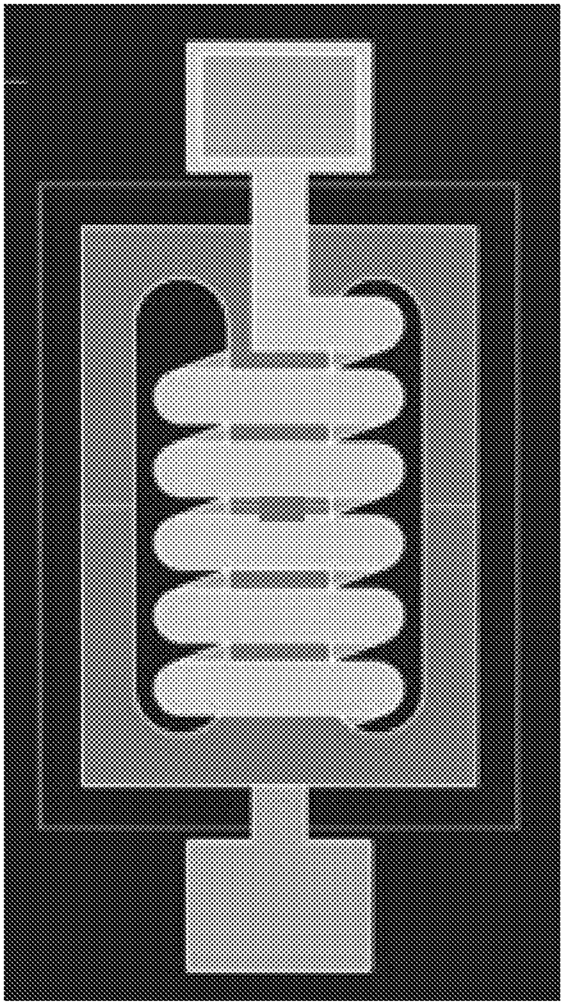
FIG. 9 is a top-down view of a laminated miniature inductor having 5.5 turns.
Figure 10:
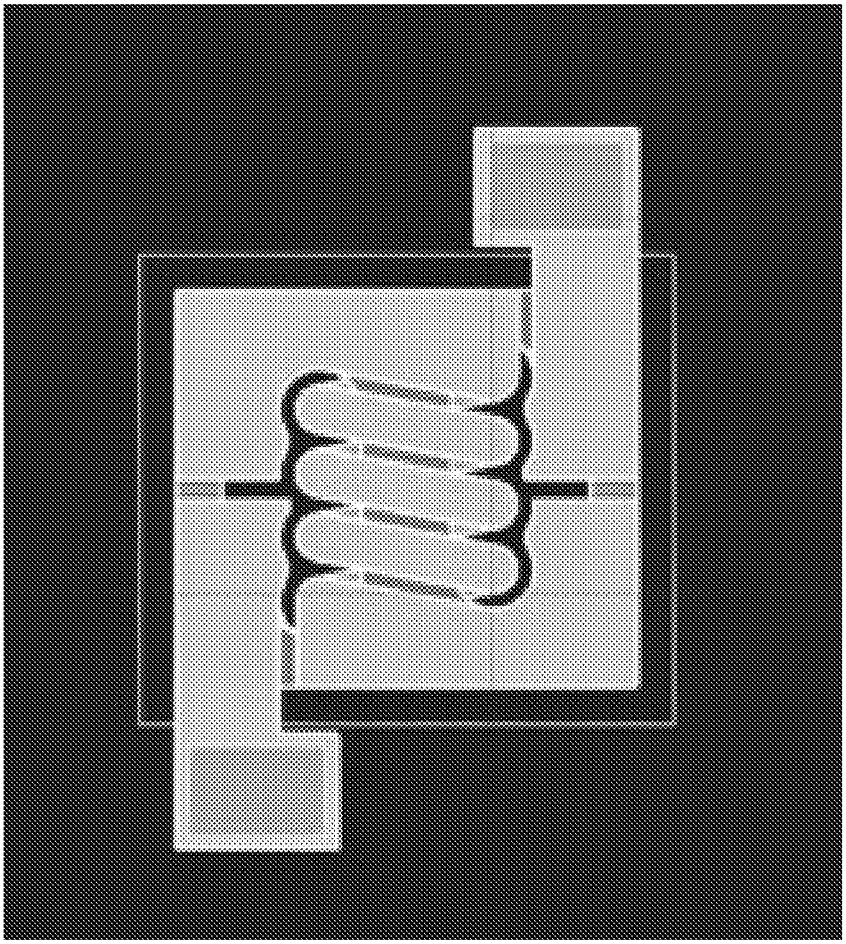
FIG. 10 is a top-down view of a laminated miniature inductor having 5 turns.
Figure 11:
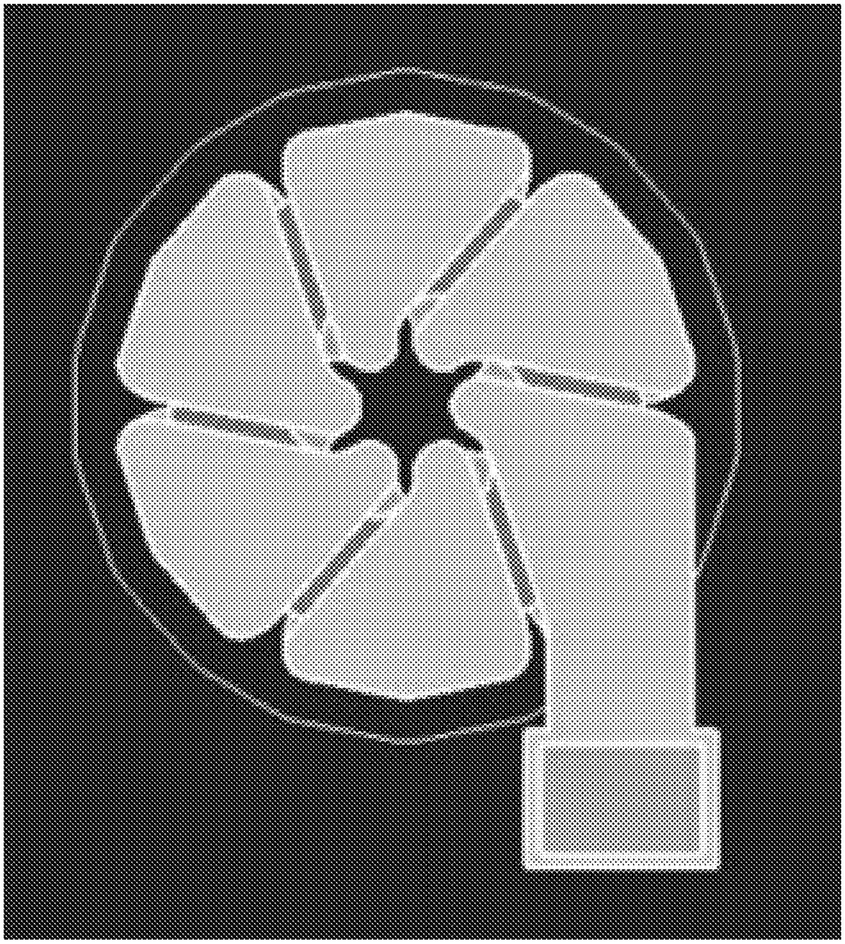
FIG. 11 is a top-down view of a laminated miniature inductor having 6 turns and a DC coil resistance of 42.2 mOhm.
Figure 12:
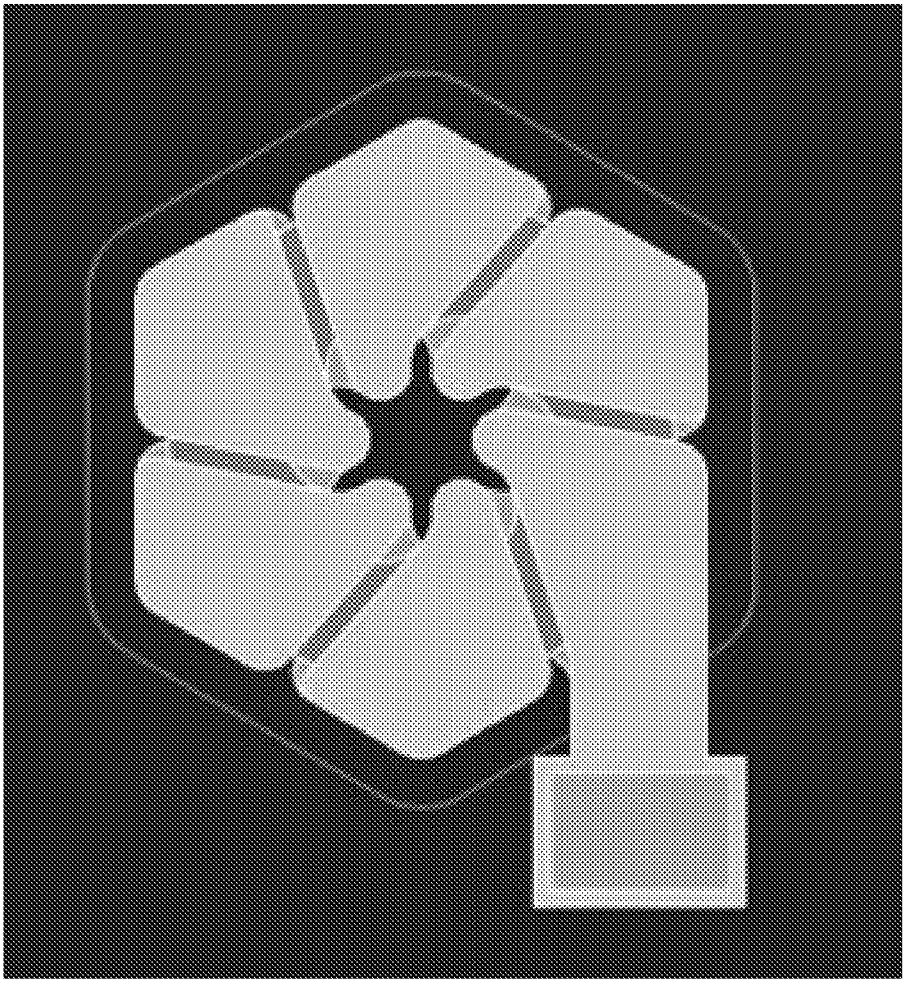
FIG. 12 is a top-down view of a laminated miniature inductor having 6 turns and a DC coil resistance of 32.5 mOhm.
Figure 13:
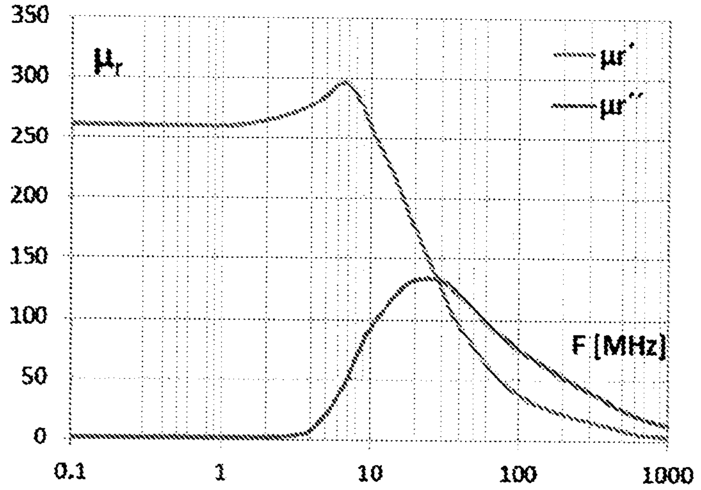
FIG. 13 shows $\mu_r'$ and $\mu_r''$ as a function frequency of a common ferrite material.
Figure 14:
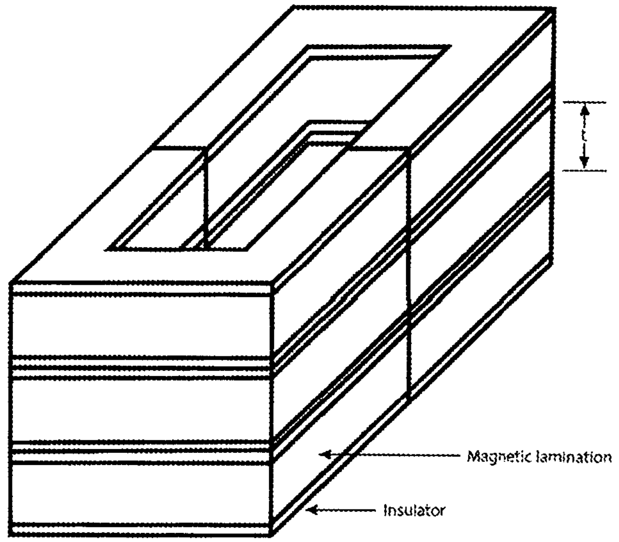
FIG. 14 shows a perspective view of a laminated magnetic core.
Figure 15:
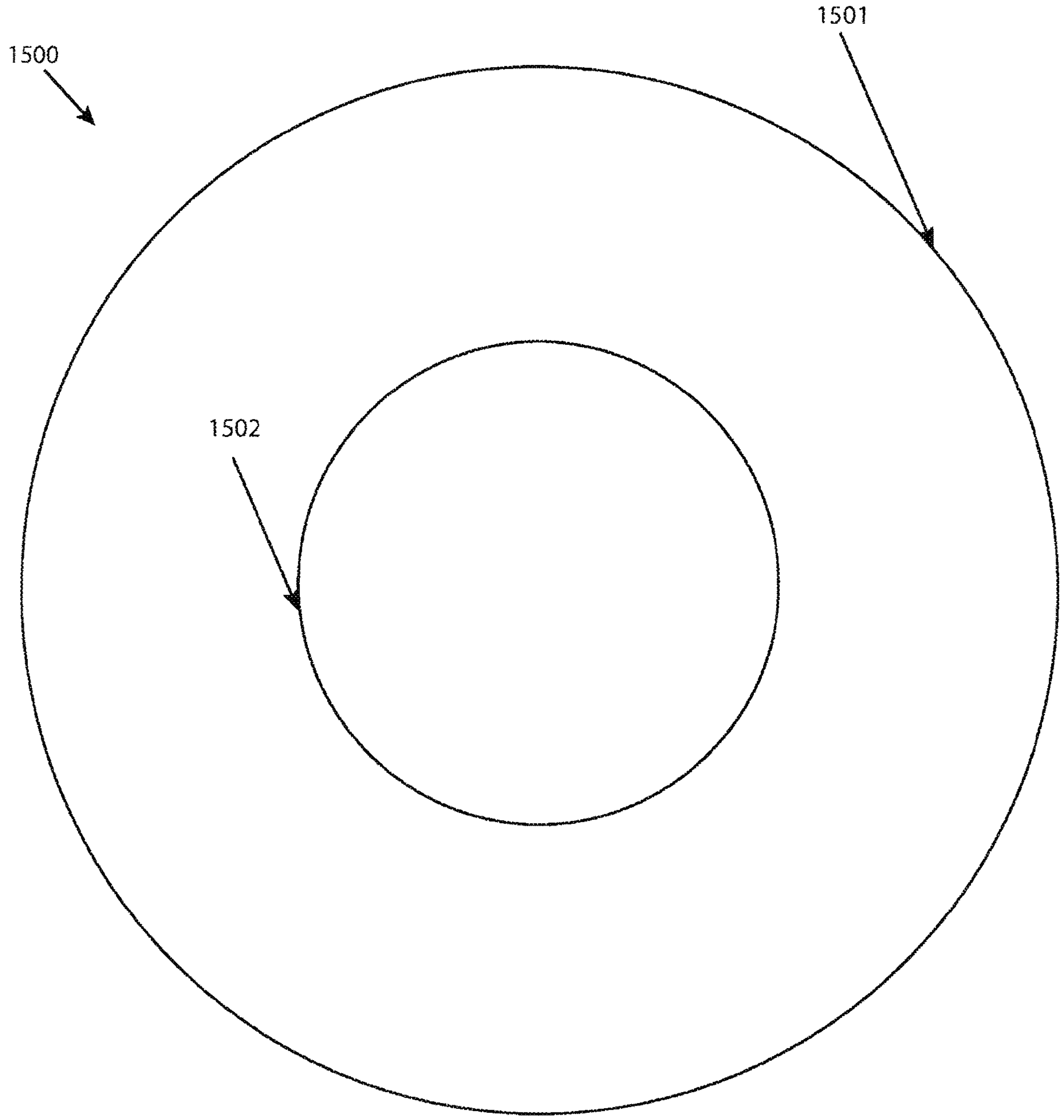
FIG. 15 is a top-down view of toroidal magnetic core without an air gap.
Figure 16:
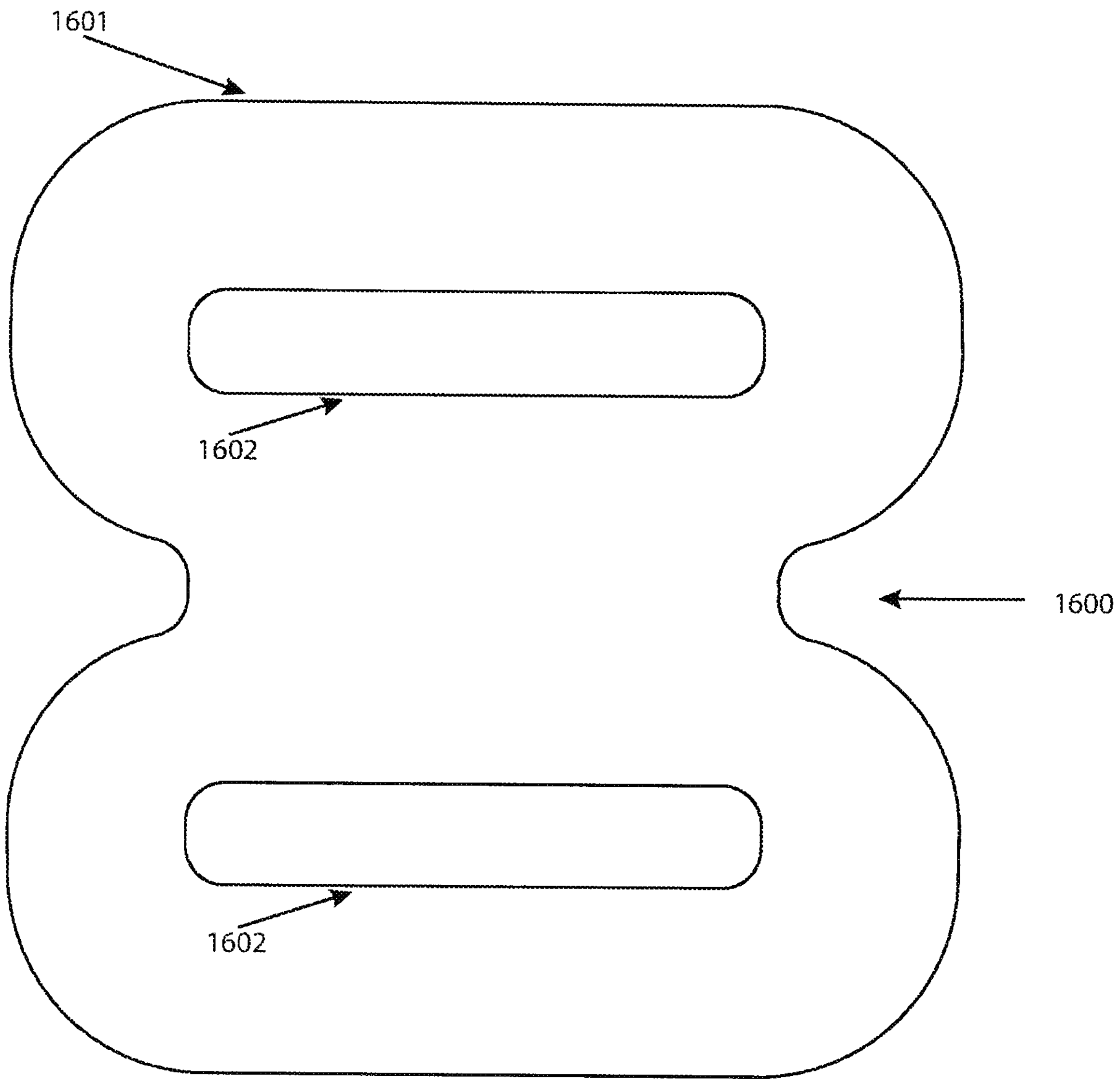
FIG. 16 is a top-down view of a hybrid magnetic core without an air gap.

Altering the cross-section of these gaps so that they are diagonal, as shown in FIG. 4, increases the gap volume over a vertical gap cross-section shown in FIG. 3 by being longer than the vertical cross-section. Therefore, a diagonal cut spreads heat evenly throughout the core. These cuts may have any cross-section.

Figure 29:
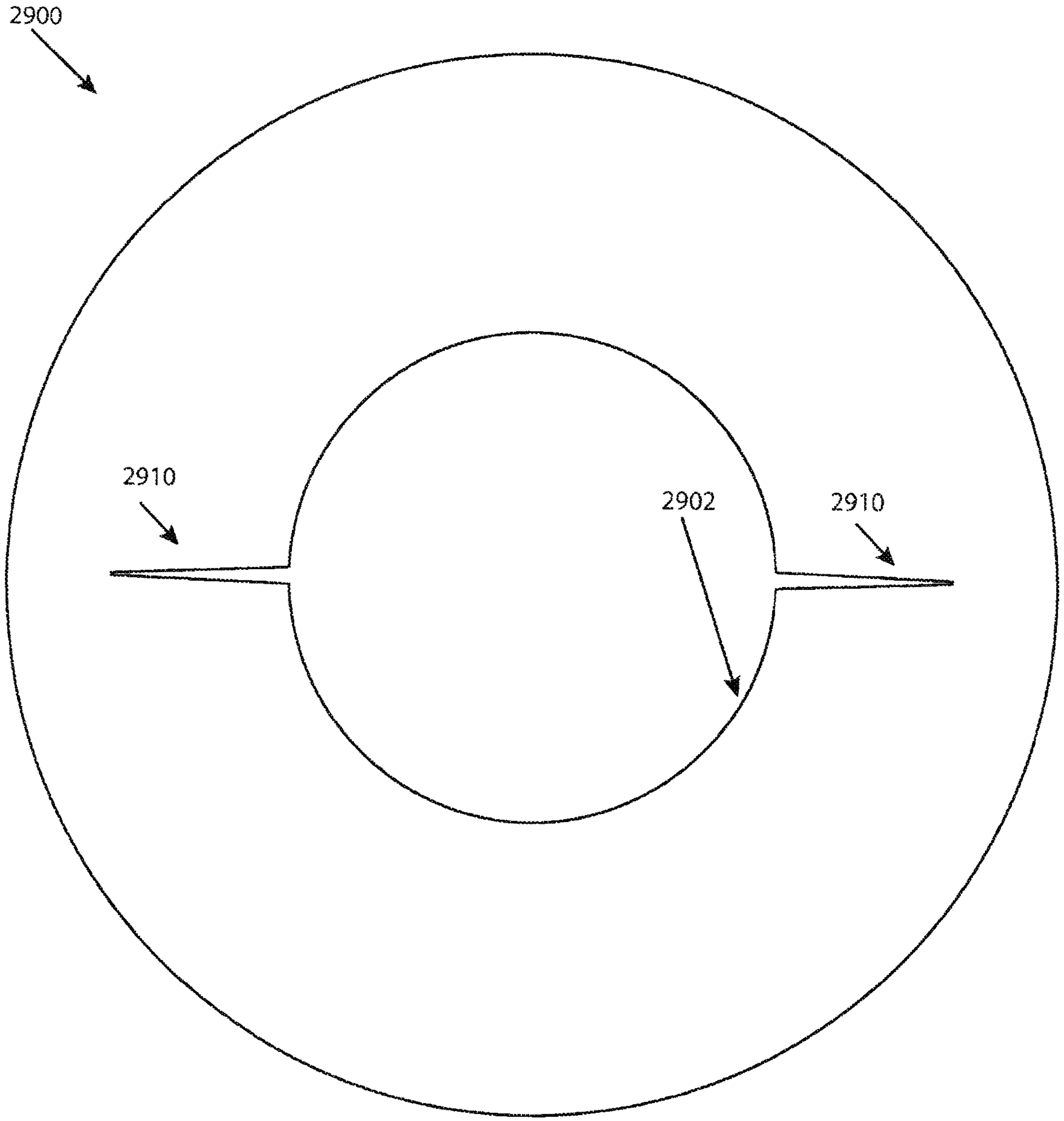
FIG. 29 is a top-down view of a magnetic core having a partial air gap that transverses the core from the inner edge towards the outer edge, but does not reach it, and narrows as it approaches the outer edge.

To provide cores where all or a chosen percentage of pathways saturate at once, a spiral or an air gap with varying widths may be utilized. This is shown in FIG. 29, where magnetic core 2900 has partial air gaps 2910 starting at the inner edge 2902, which narrows as they get farther from the inner edge. This is useful in some cases, for example, a toroidal core. Having a small partial air gap widened at the inside diameter will tend to keep some of the magnetic flux lines further away from the inner diameter under higher current, which otherwise would take the shortest path through the partial air gap along the edge of the core.

Figure 30:
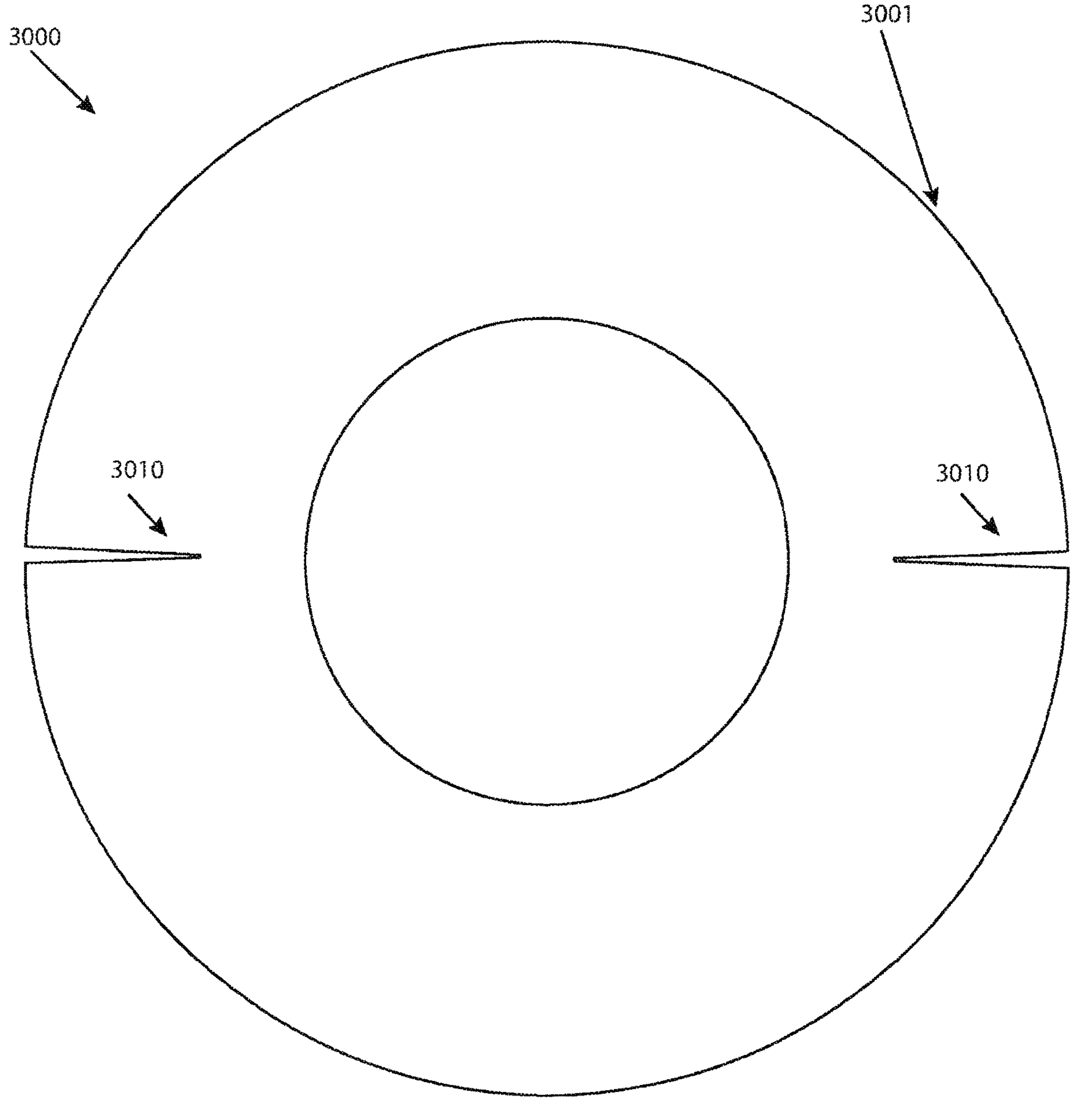
FIG. 30 is a top-down view of a magnetic core having a partial air gap that transverses the core from the outer edge towards the inner edge, but does not reach it, and narrows as it approaches the inner edge.

FIG. 30 shows a magnetic core 3000 with a partial air gap 3010 also having a varying width. The width of the air gap 3010 is greater at the outer edge 3001 of the magnetic core 3000. As the width of the gap increases, the reluctance it presents to magnetic flux lines increases. Therefore, the reluctance of each pathway through the partial air gap can be set so that the magnetic flux fills the air gap at a desired current level. Varying width air gaps can be set so that current may scale linearly so that there is no inductance drop-off over a wide range of current.

The air gaps can also start at the inner edge of the core and widen as they approach the center. The width of an air gap will be calculated given the endpoints of the air gap, the end angles of the gap, and the desired effect. Varying the width of an air gap allows for core to present a uniform reluctance across all flux pathways across the air gap spreading out the flux. This is because the longer flux pathways offer more impedance than shorter flux pathways.

Figure 31:
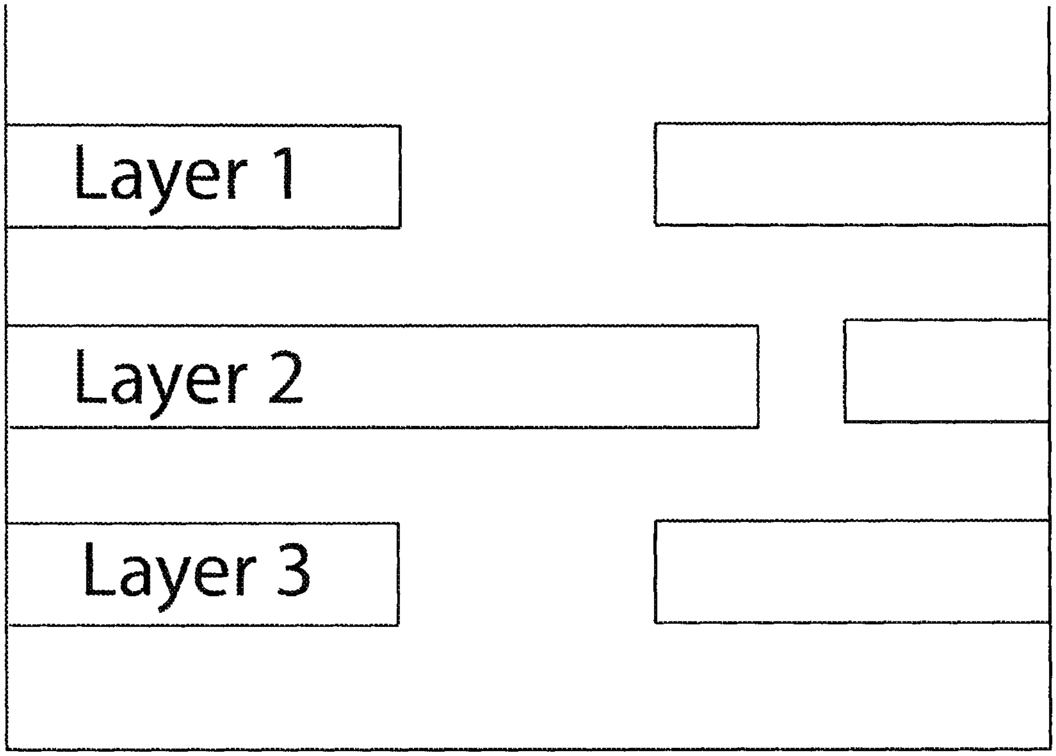
FIG. 31 is a side view of a generalization of magnetic core layers with each layer having an air gap offset from the air gaps of the other layers.

In laminated magnetic cores, each layer may have at least one partial air gap. Typically, the air gaps of each layer would be at least minimally offset, so that they do not overlap at all, to avoid interference from fringing and eddy current formation, and an offset arrangement is shown in FIG. 31.

Figure 32A:
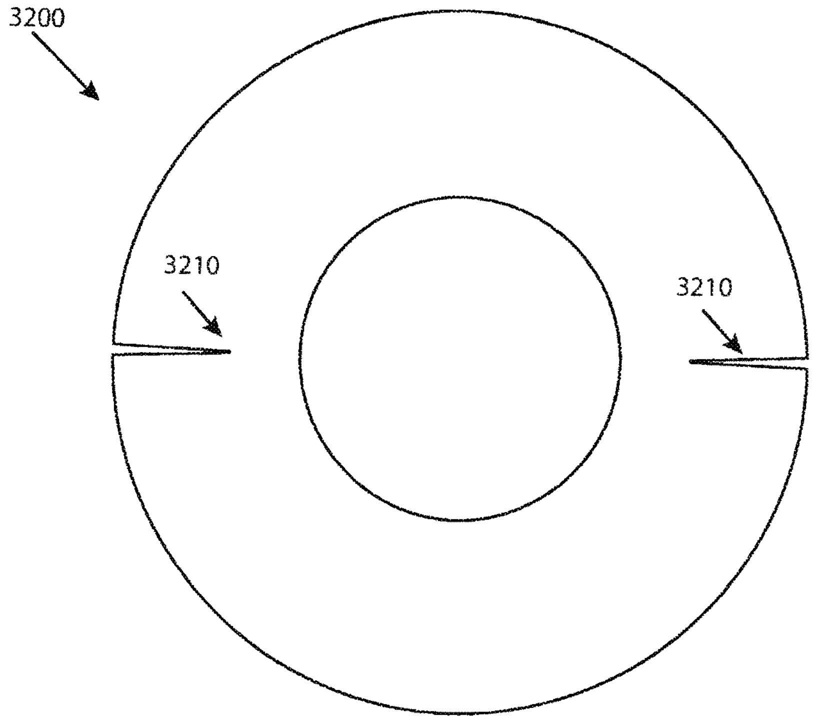
FIG. 32*a* is a top-down view of the first layer of a multi-layer magnetic core having two partial air gaps.
Figure 32B:
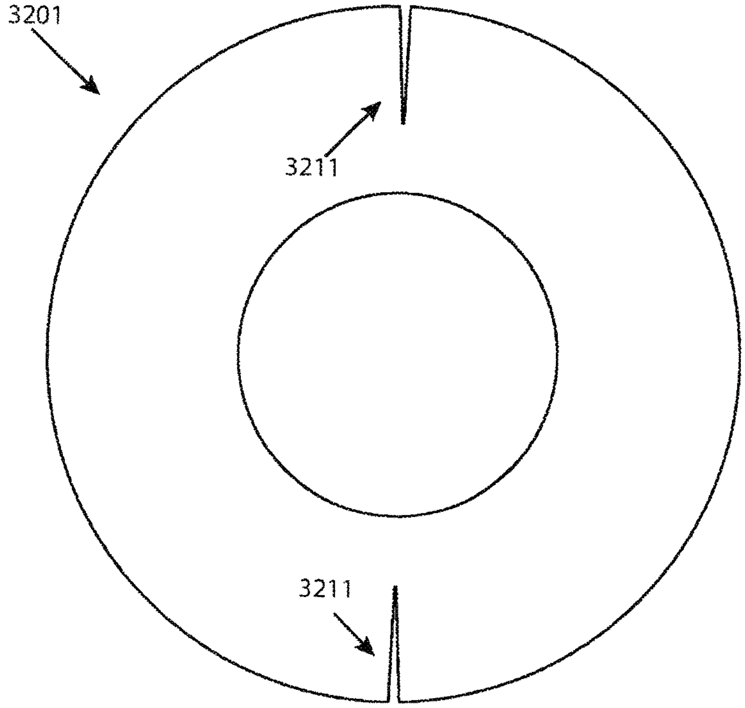
FIG. 32*b* is a top-down view of the second layer of a multi-layer magnetic core having two partial air gaps.
Figure 32C:
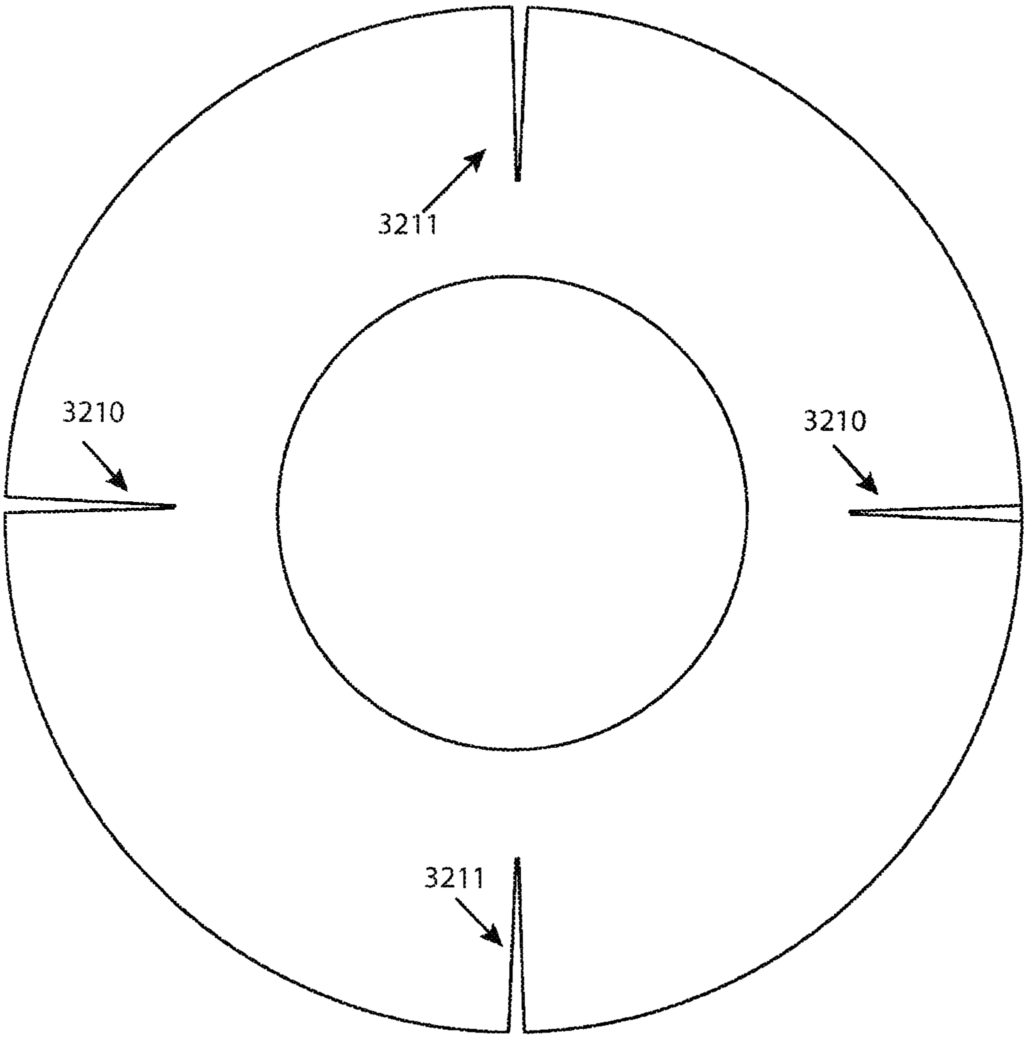
FIG. 32*c* is a top-down view of the layer of 32*b* stacked on the layer of 32*a*. The air gaps of both layers are shown to demonstrate the distribution of the air gaps even though, in reality, the air gaps of layer 9*a* would not be seen in a top-down view.

Optimally the core layers would be offset as shown in FIG. 32: FIG. 32*a* shows a first magnetic core layer 3200 with partial air gaps 3210. FIG. 32*b* shows a second magnetic layer 3201 with air gaps 3211. FIG. 32*c* shows a top-down view of magnetic core layers 3200 and 3201 with air gaps 3210 and 3211 showing the air gaps of each layer are offset from each other.

There are numerous permutations of the possible air gaps and air gap dimensions. However, it is well possible to determine the optimum dimensions and numbers of air gaps if a given curve is selected. It is also possible to form an altered graph by selecting air gap dimension or number according to the principles of partial air gaps discussed above.

Figure 33:
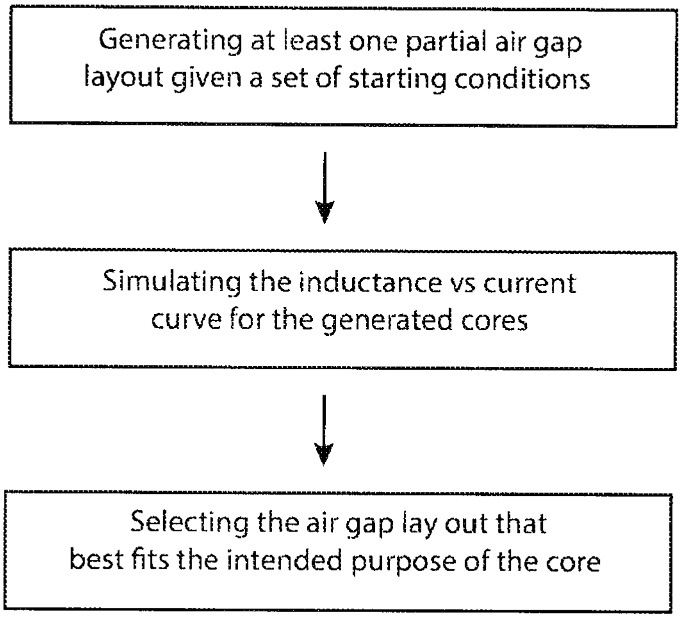
FIG. 33 is a flow-chart of an elegant but un-optimized method of the present invention.

A flow chart showing a method of arriving at an air gap layout suitable for intended purposes is given in FIG. 33. The first step is to generate at least one partial air gap layout. Once an air gap layout is generated or formed, the air gap layout can be simulated, and if the air gap presents a usable inductance over current core suitable for use in a desired application, the generated core can be selected. If no suitable air gap layout is found, then the steps may be repeated.

Figure 34:
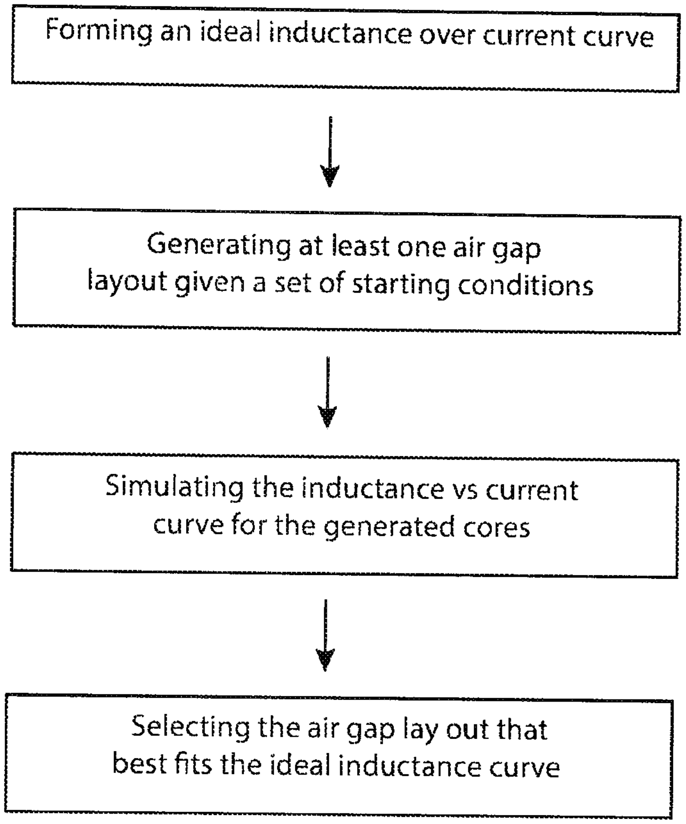
FIG. 34 is a flow-chart of an optimized method of the present invention.

However, this is an inefficient method for selecting a suitable air gap. A more efficient method of selecting a suitable air gap is to first select a suitable target inductance over the current curve for the core, generate an air gap layout given initial starting condition inputs, to simulate the air gap layouts generated given the initial starting conditions, and to select a generated air gap layout that is best suited or at least useable based upon the targeted inductive over current curve. This process is shown as a flow chart in FIG. 34

Therefore, in general, it can be seen that the dimensions and pathway through the core are calculated according to the initial starting conditions, and the resulting design is manufactured. Certain limitations may be included in the calculation, such as manufacturing constraints like limited angles. But in lithography, which is used to build miniature inductors used in the semiconductor industry and often integrated into packaging, the air gaps may be formed by patterning as the layers are built up, removing most practical barriers to air gap formation. The lithographic processes allow for far more air gap geometries than a simple cutting of the larger steel or ferrite core could.

To generate a cut layout, for example, even taking into account any physical limitations of laminated cores, and to actually have a simulation of a core with partial air gaps, the following process is used.

(There are many forms of cores, and this method holds across the varied core shapes and dimensions, although the final implementation of the design into a core may only be achievable on core created by a build-up process as in lithography. Here, a laminated toroidal magnetic core with windings on the magnetic core is used as an example.)

When determining a suitable air gap pattern for achieving the ideal target curve, a computer implemented software may help with this step if given an "Air-Gap Describing Function." (In this computer implemented method inputs are made by a graphical user interface.) The Air-Gap Describing Function is a combination of two general functions, which are named as the first and second cut curves. The air gap is the region between them. These two functions are in very similar form and can be in any degree.

The "first cut" functional definition is given as, $$r_{CUT1} = f(r_{in1}, \phi_{in1}, r_{out1}, \phi_{out1}) \quad (1)$$

$r_{in1}$, $r_{out1}$, $\phi_{in1}$, $\phi_{out1}$ are radiuses where the first cut starts and ends and circular coordinate angles with reference to x axes measured in an anti-clockwise direction as shown in FIG. 25*a* and FIG. 25*b*.

The second cut is in the similar form and describes the second cut curve of the air-gap, which is given as $$r_{CUT2} = f(r_{in2}, \phi_{in2}, r_{out2}, \phi_{out2}) \quad (2)$$

Figure 35A:
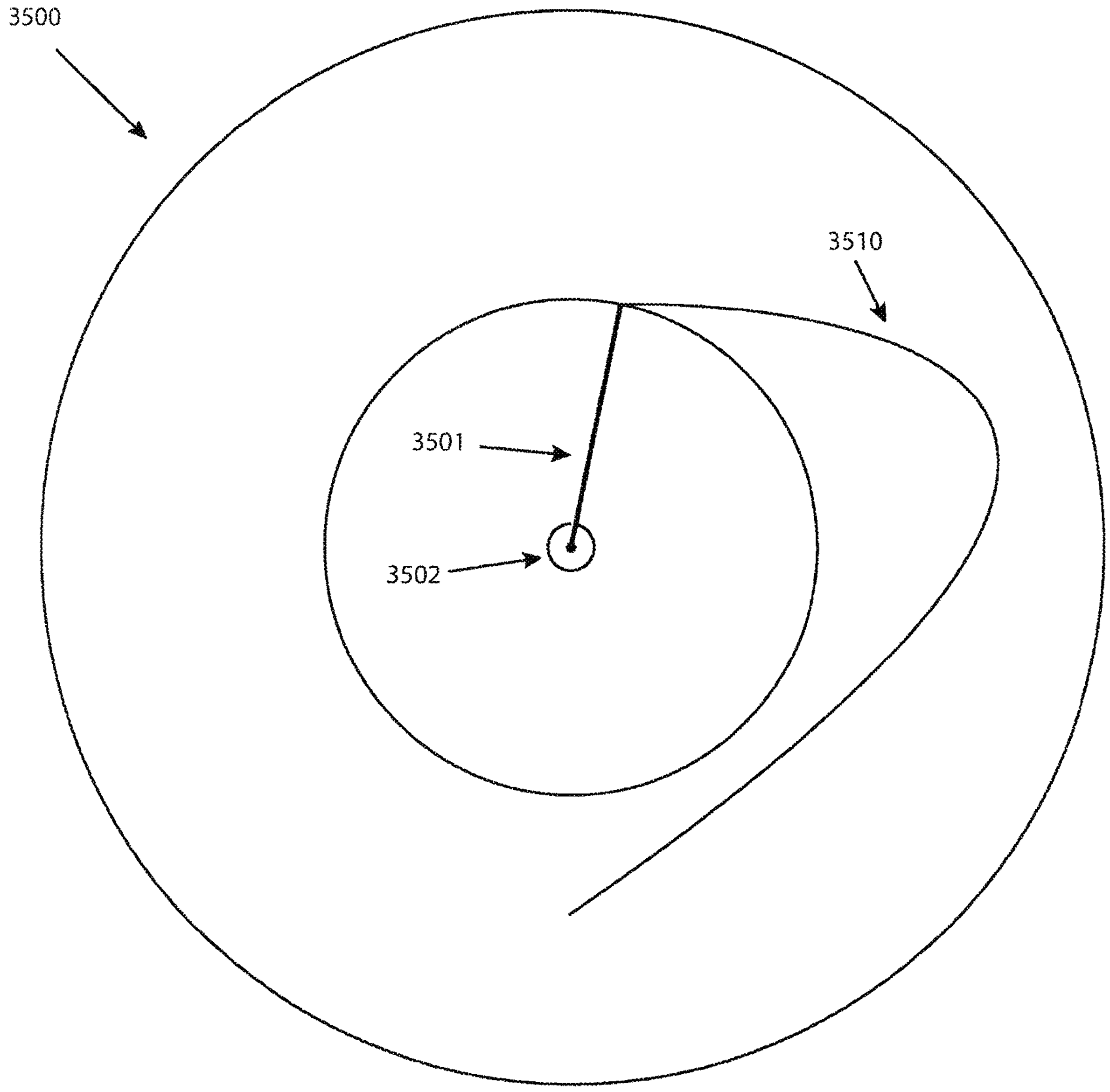
FIG. 35*a* is a top-down view of a magnetic core with a cut demonstrating the initial input conditions for the start of the cut.
Figure 35B:
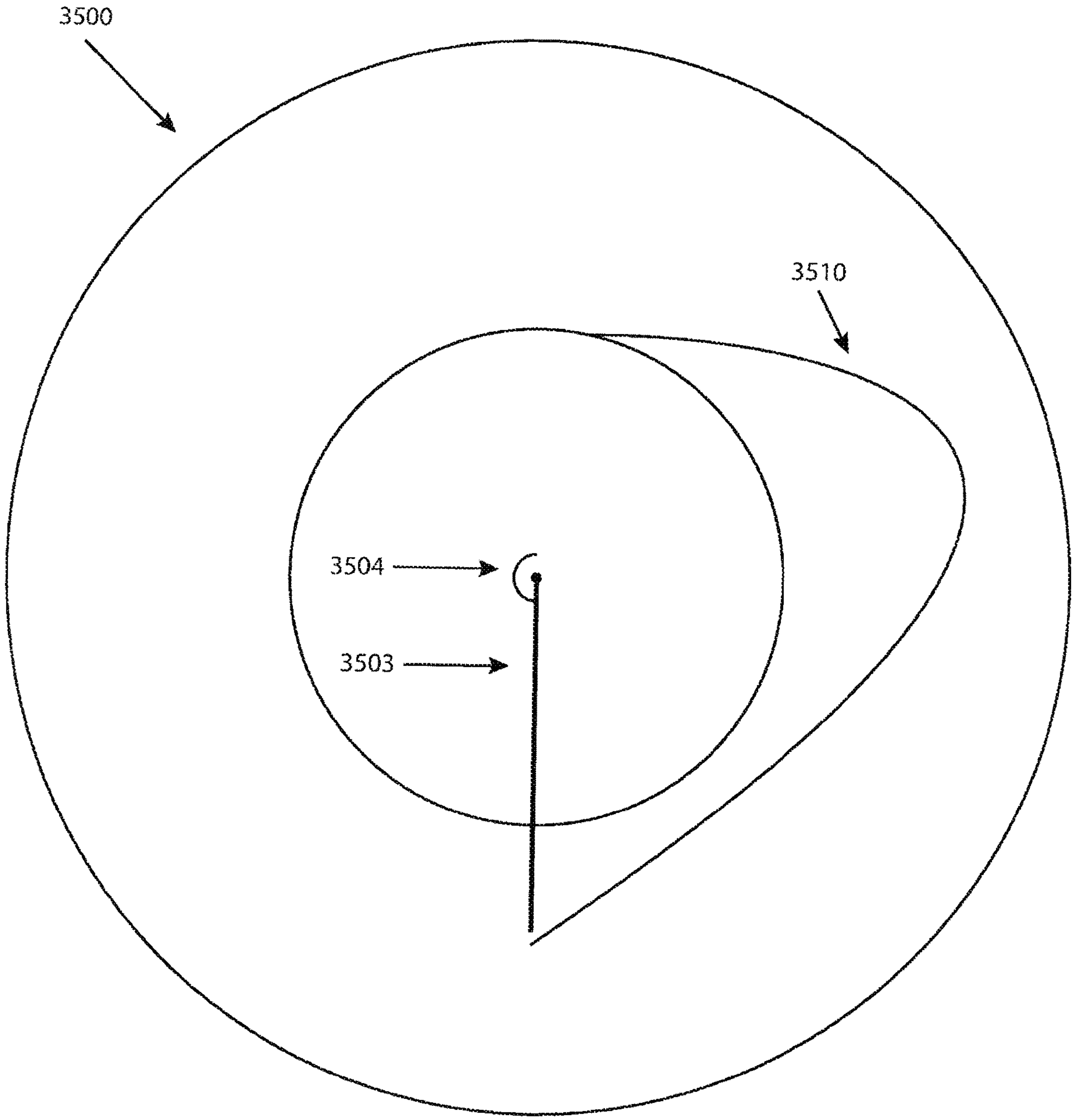
FIG. 35*b* is a top-down view of a magnetic core with a cut demonstrating the initial input conditions for the end of the cut.

$r_{in2}$, $r_{out2}$, $\phi_{in2}$, $\phi_{out2}$ are radiuses where the second cut starts and ends and circular coordinate angle with reference to x axes measured in an anti-clockwise direction as shown in FIG. 35*a* and FIG. 35*b* respectively. In FIG. 35*a* a first cut 3510 has been made in the core 3500 the cut starts from a position that is determined by $r_{in}$ 2501 and the angle of $r_{in}$, which is $\phi_{in}$ 3502. FIG. 35*b* shows the same core 3500 with the same air gap cut 3510, but it demonstrates $r_{out}$ 3503 and $\phi_{out}$ 3504. The resulting gap may follow a variety of curve pathways between the two points, and therefore, a wide range of air gaps can be created. The only condition imposed on these functions is that they have to be continuous analytical functions in the interval of their arguments, a very simple condition to satisfy.

Figure 36:
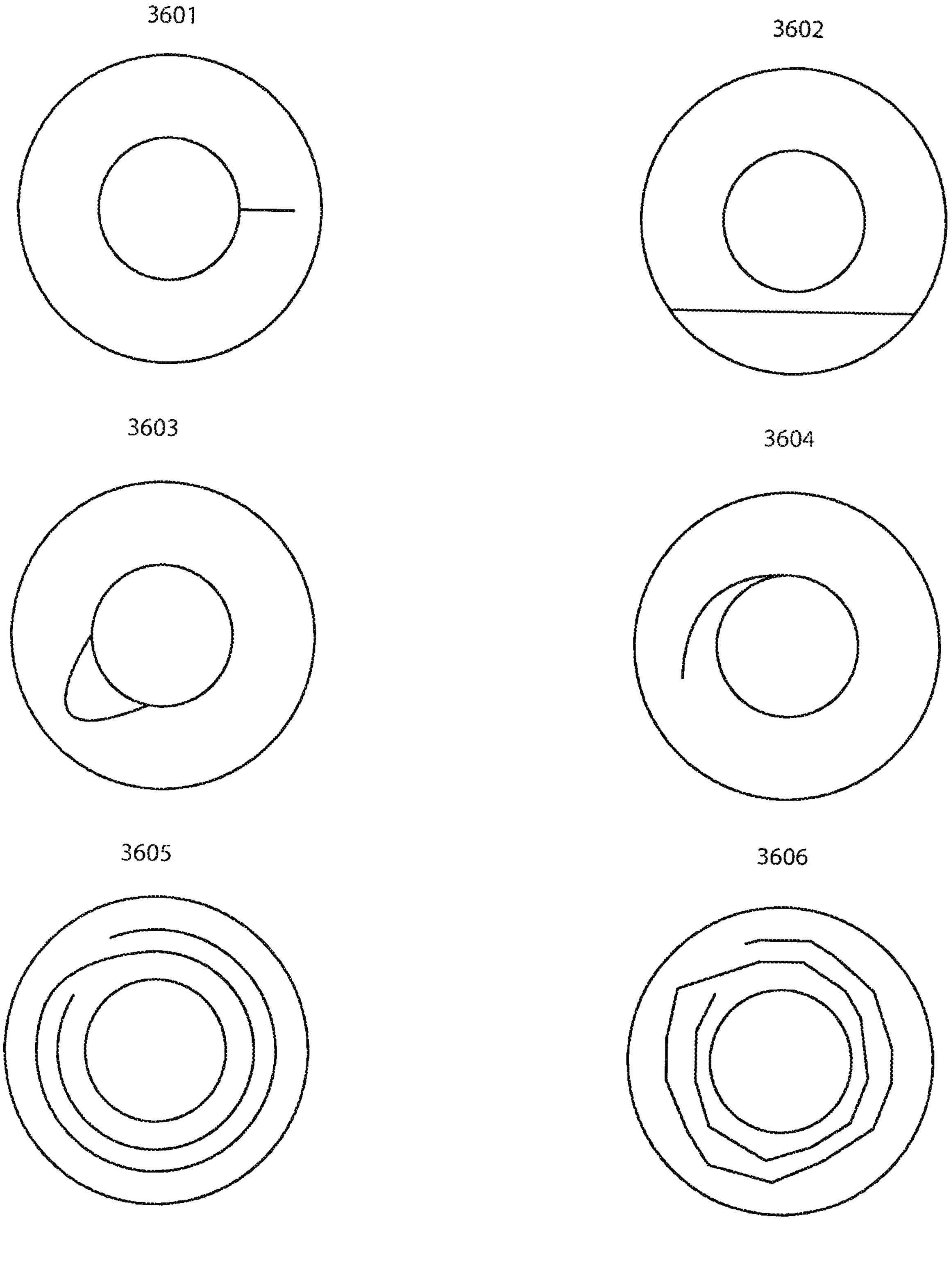
FIG. 36 shows top-down views of several air gap cut styles.

FIG. 36 shows a sample of a variety of air gaps possible through linear functions of 4 independent variables. The first is a straight partial air gap 3601; the second is a partial air gap 3602 going from one point on the first edge to another point on the first edge, 3603 is another variant of the first edge to first edge gap, 3604 is a partially curved air gap from a first edge, and 3605 is a partial curve cut that spirals around the core. A gap may also start in the middle of the core. In some cases, it may be practical to first generate a cut and then produce a crude linear approximation of the cut, and as such 3606 shows a crude approximation of what would be a smoother spiral cut as in 3605. Any curved cut can have an approximation of it formed by taking a generated cut and then approximating the cut with a series of straight lines.

Figure 37:
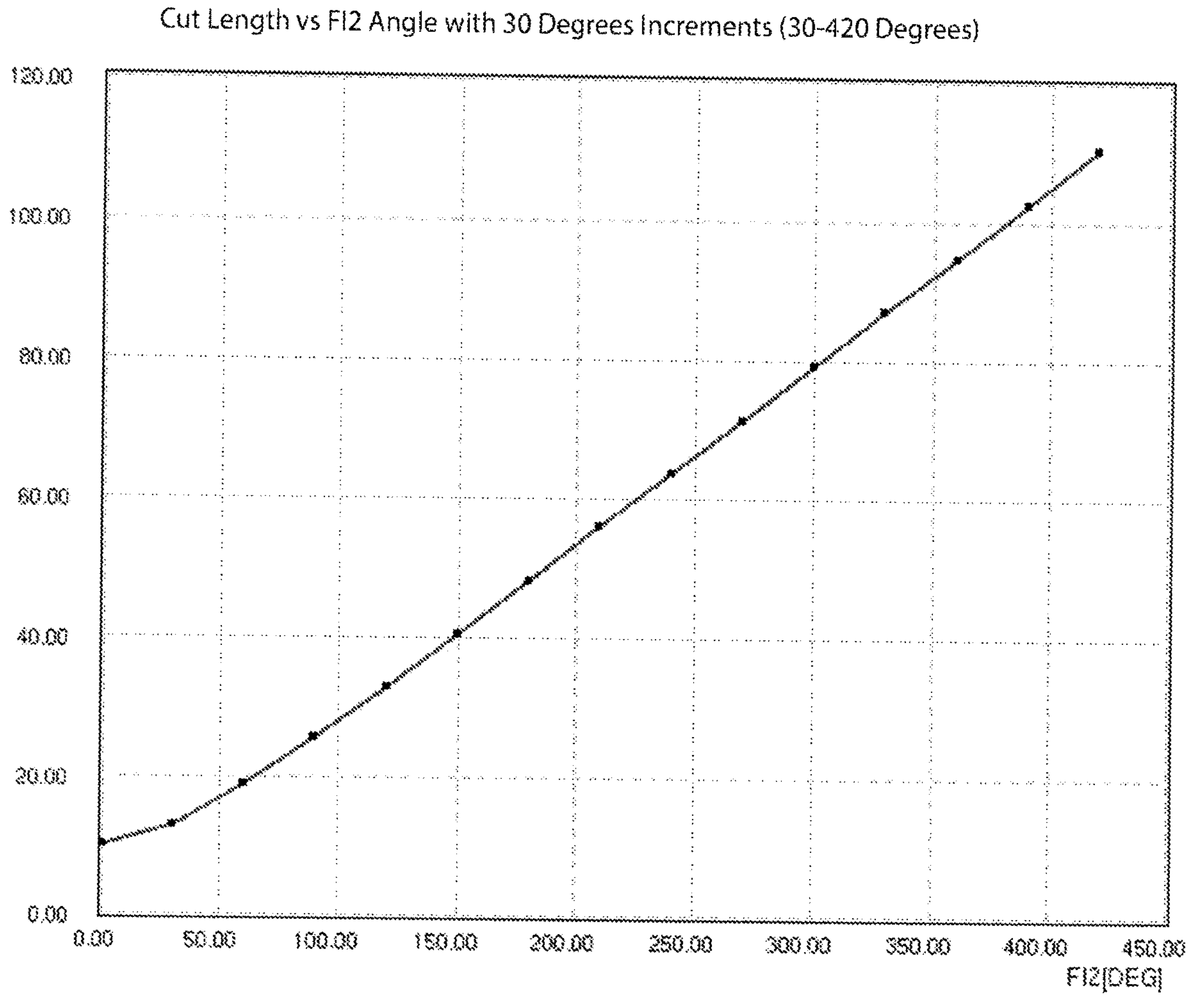
FIG. 37 shows the cut line length as a function of $\Delta\phi$ between the initial in coordinate cut angle and the initial out cut coordinate angle.

As can be seen, the air gaps can be a simple radial cut, or a full curved cut, or a partial curved cut and they can be even several turns in the core being even several times longer than the toroidal core circumference, which can be very useful in optimizing heating issues! FIG. 37 shows the cut line length as a function of $\Delta\phi$.

Figure 38:
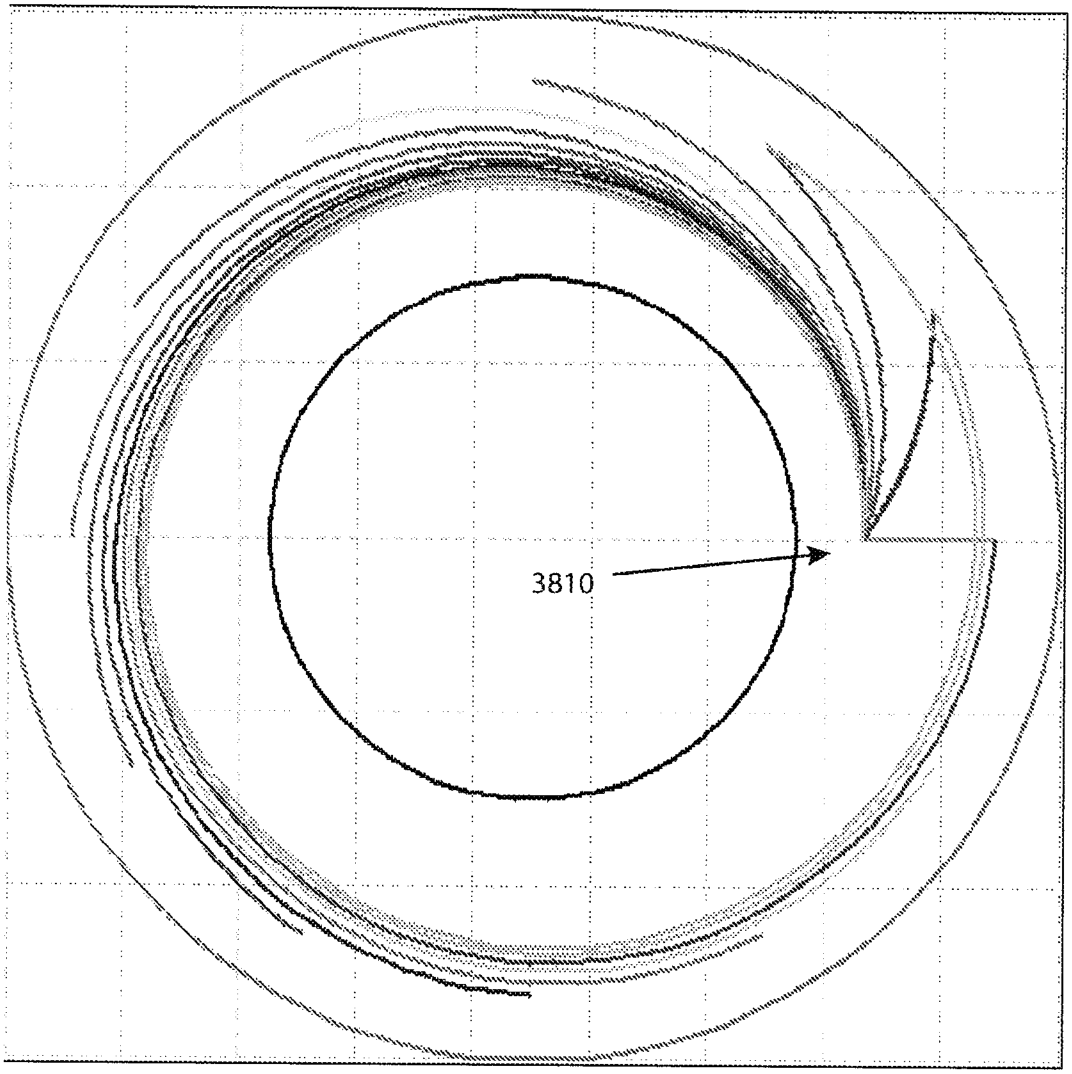
FIG. 38 is a top-down view of a toroidal core having 15 cuts.

Any number of air gaps in a single layer can be generated, and an example of a core layer 3800 with fifteen air gap cuts 3810 is shown in FIG. 38.

Figure 39:
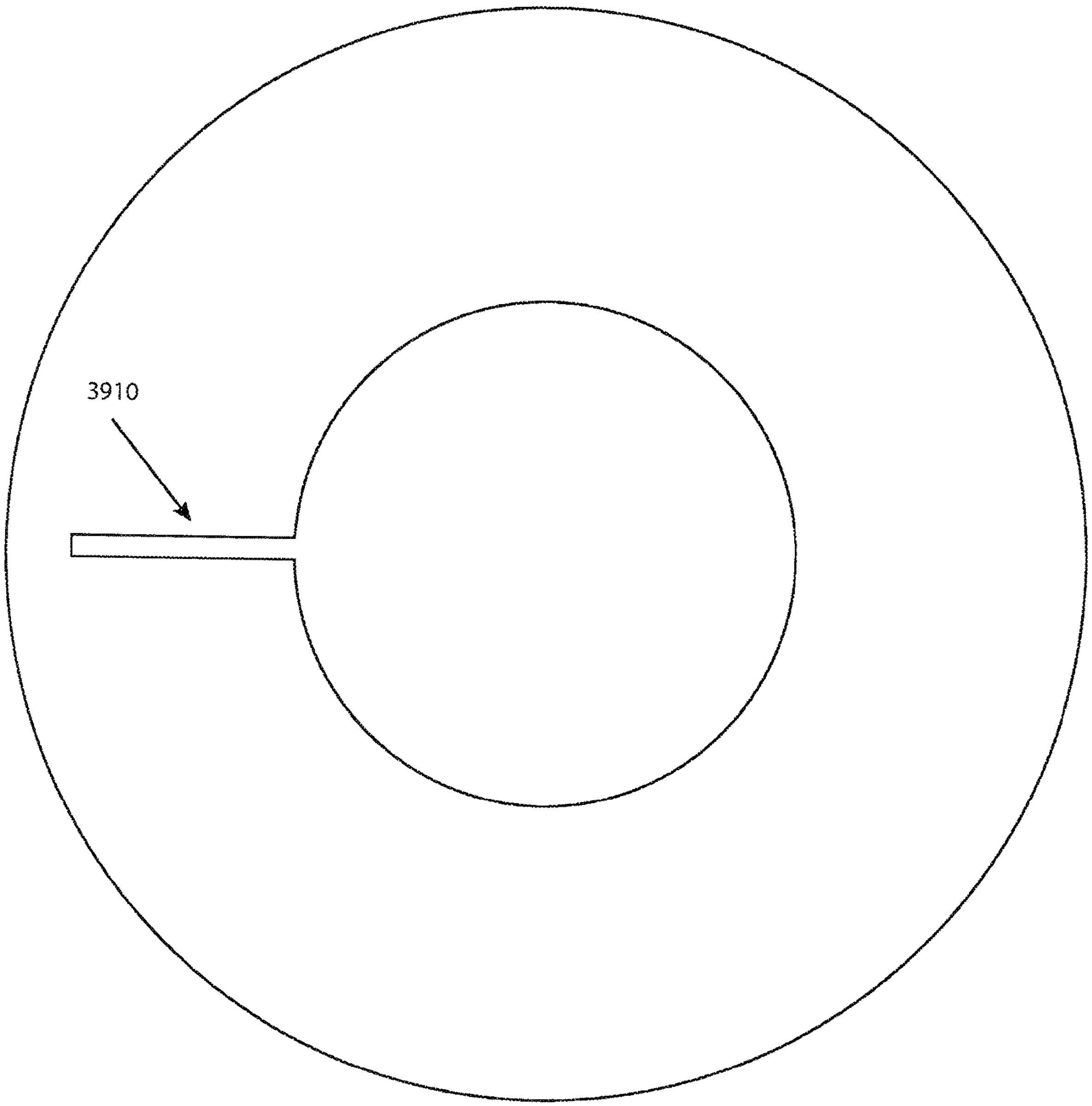
FIG. 39 is a top-down view of a core having a straight partial air gap design.
Figure 40:
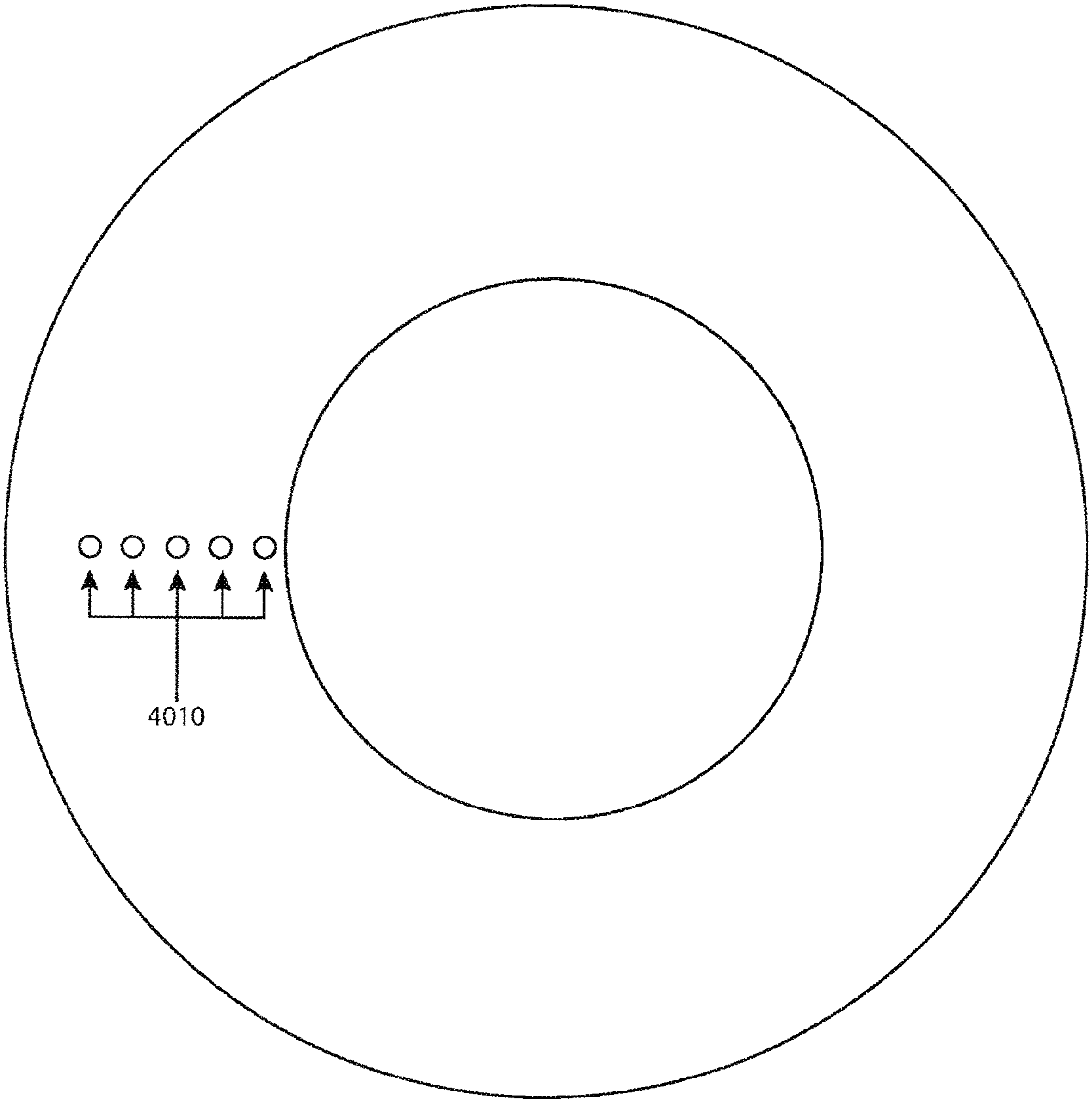
FIG. 40 is a top-down view of the core of FIG. 39 now having a stitching air gap pattern approximating the straight partial air gap design.
Figure 41:
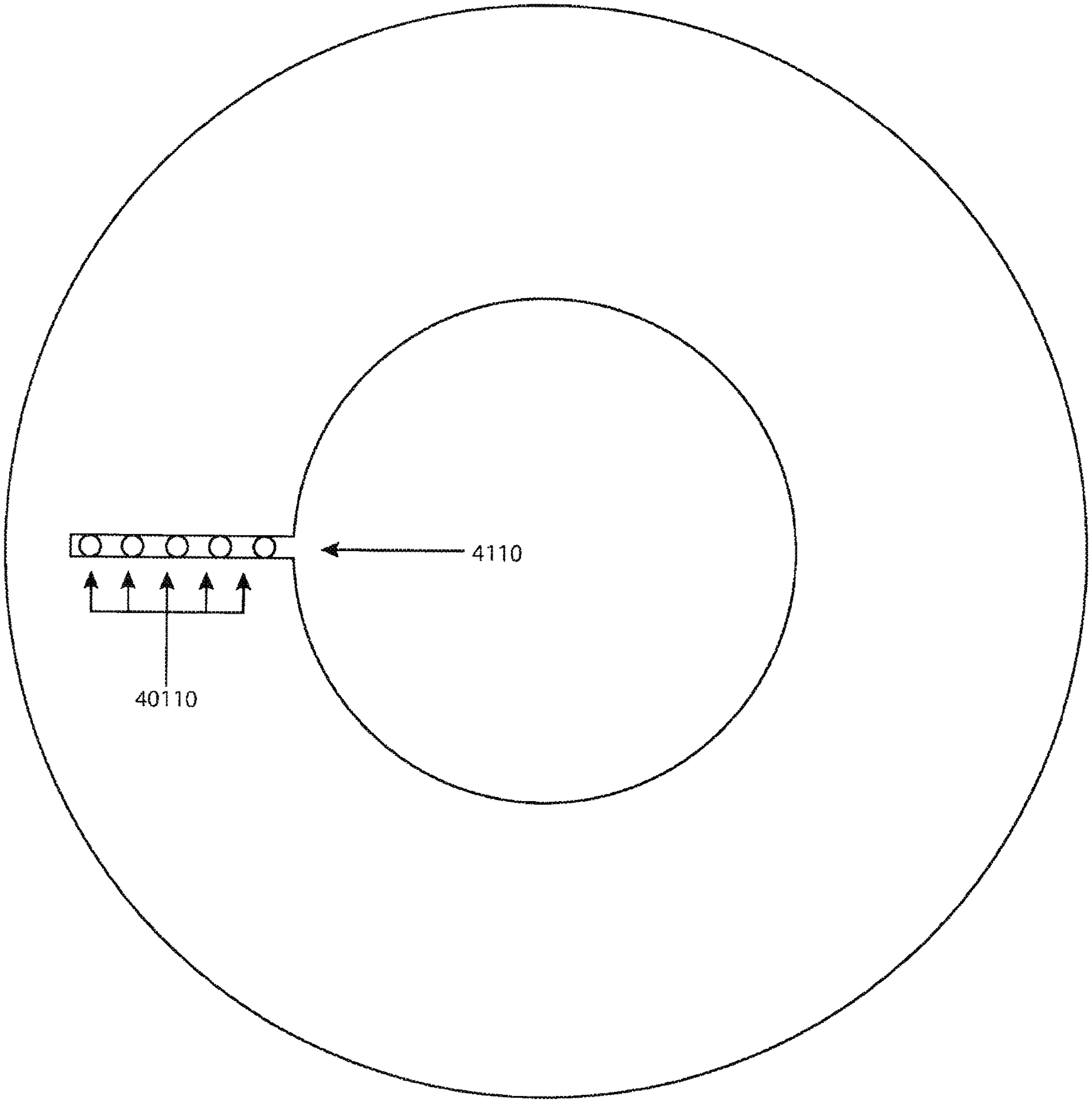
FIG. 41 is a top-down view of the core of FIG. 40 having the straight partial air gap design of FIG. 39 overlayed onto the stitching pattern of FIG. 40 to show that they are related as an approximation of each other.

When an air gap is generated the air gap cut may be approximated by a string of partial cores in a stitch-like pattern. FIG. 39 shows a core was a straight partial air gap 3910. FIG. 40 shows a pattern of smaller partial air gaps 4010 that follow the airgap cuts 3910 of FIG. 39. FIG. 41 shows an overlay of the straight partial air gap 3910 of FIG. 39 with the stitching pattern 4010 of FIG. 40 so that it can be seen that they would fit together. Any pair of edge cuts can be translated into this stitching pattern. A stitching pattern is where a continuous partial cut has been replaced with a series of partial air gaps that follow the original air gap pathway. Stitching patterns are particularly useful for relieving mechanical stress on the core.

A third pattern of partial air gaps may be generated. This involves first excluding an area of the core from normal air gap cuts, selecting an air gap size and density, and then filling the area with a number of the air gaps as fit in the area. There are many particular ways to follow this style of designing multiple air gaps in a singular area, but the preferred method of this patent is to automatically generate them with a given gap radius and density on a layout and field simulation input deck by excluding the gap geometries by "exclusion" areas defined by the generated air gaps. This is a computer-implemented method.

Figure 42:
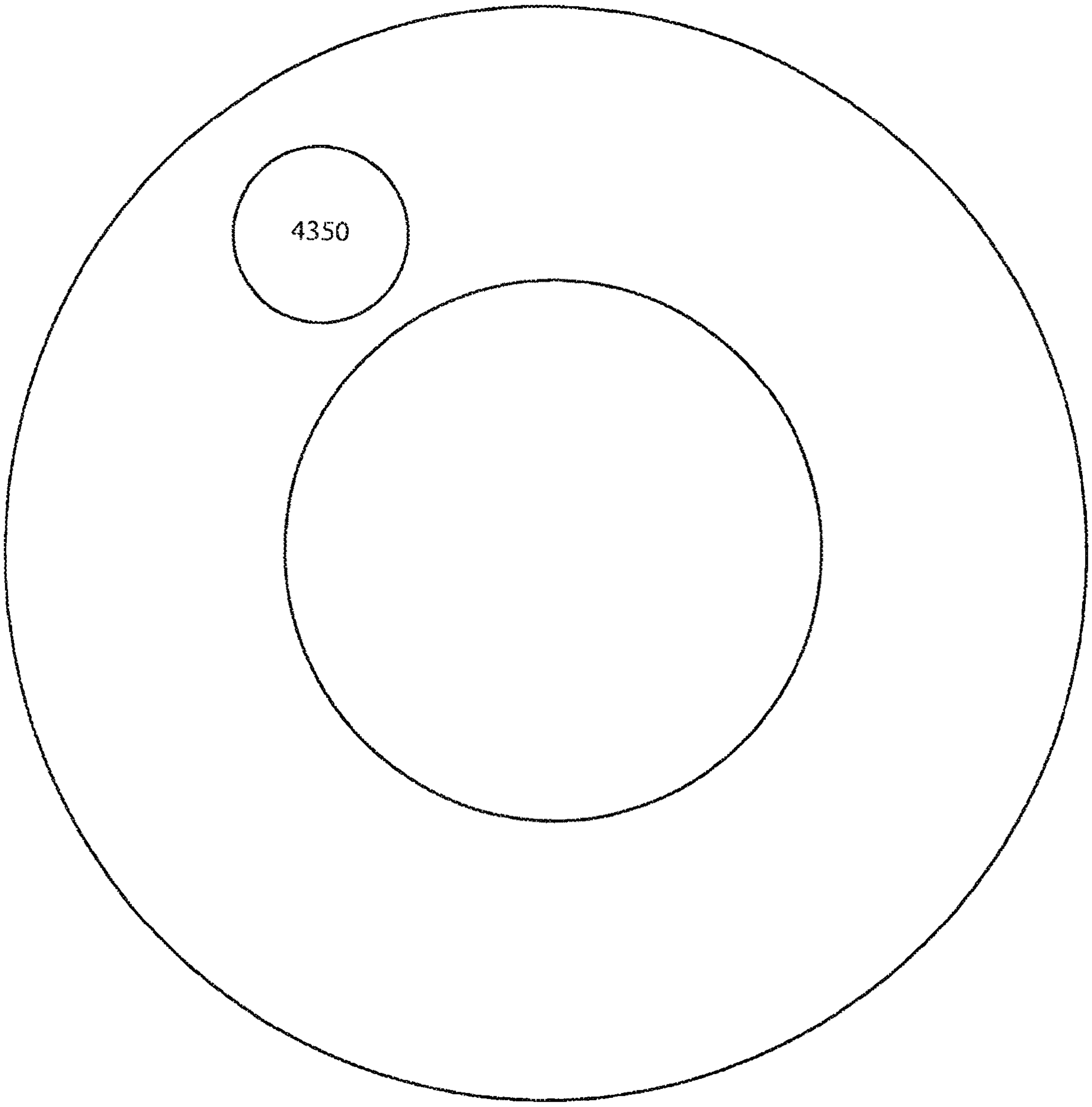
FIG. 42 is top-down view of a core having a small exclusion area in the top left corner of the core.
Figure 43:
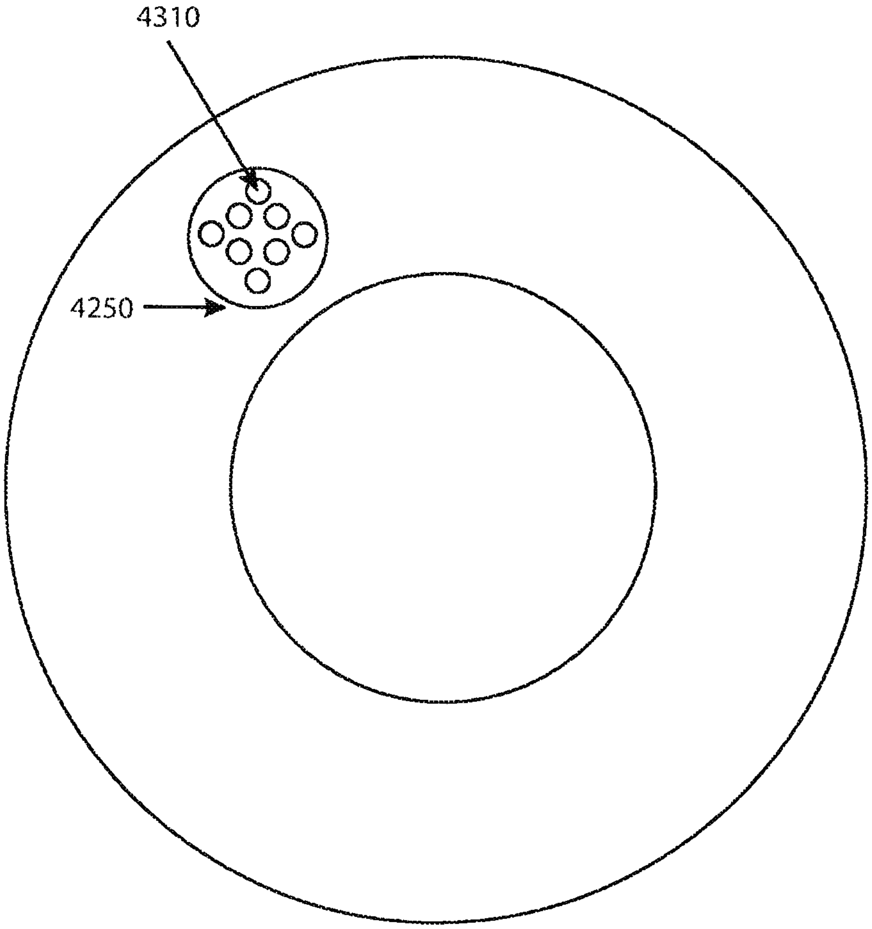
FIG. 43 is a top-down view of the core of FIG. 42 now having air gaps placed into the core according to a predetermined air gap size and destiny.

A first step would be to generate a radius and form an exclusion area, and this exclusion area 4250 is shown in FIG. 42, and if an air gap is used in conjunction with this core according to the methods of this patent, the continuous function of the cut will be excluded from entering or incorporating the exclusion area. This exclusion area 4250 can then be filled with air gaps 4310, as shown in FIG. 33 (where there are eight air gaps 4310 in area 4250) given the area gap radius and density which creates a fill factor that fills the exclusion area 4250 accordingly There is no limit on the potential size of the exclusion area and if the core is not to have other air gaps this exclusion area may cover the entire core layer area.

Figure 44:
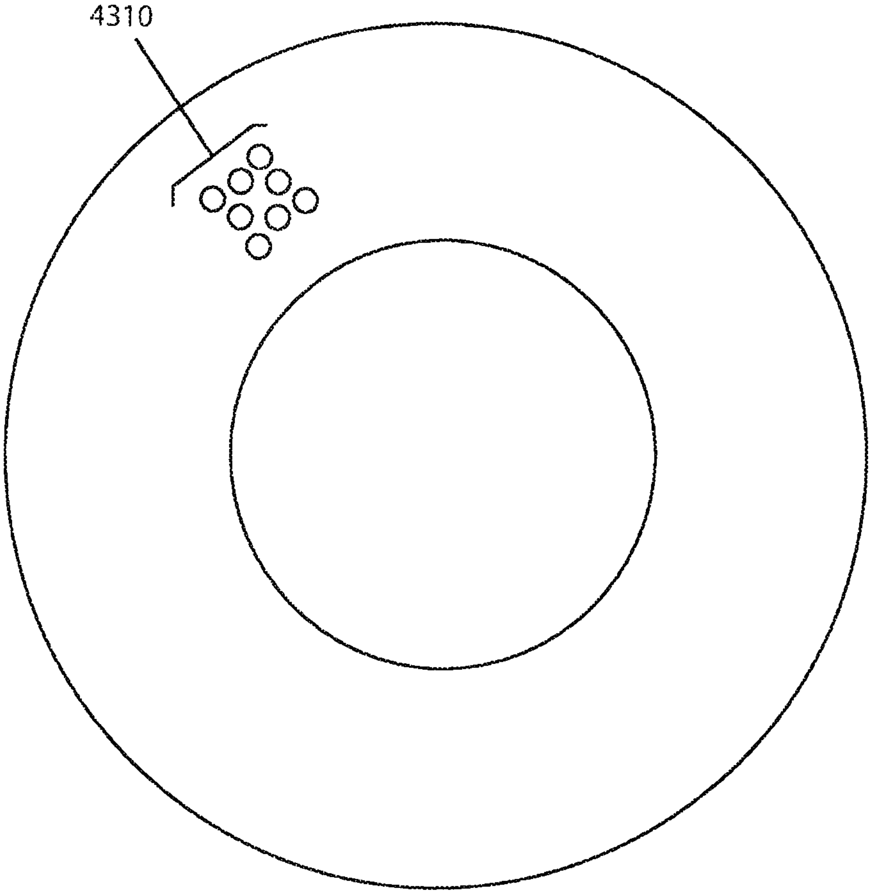
FIG. 44 is a top-down view of the core of FIG. 42 now no longer showing the exclusion area as the exclusion area would not likely be distinctly marked in a product.

The final core with air gaps 4310 is shown in FIG. 44. A core with air gaps defined by this method may have air gaps defined and created according to the cut functions defined above. In such cases, the inductance over current curve may still be simulated and the core selected accordingly.

The benefit of having an exclusion area filled with a set density of air gaps is an improvement in the mechanical tolerances of the air gap. As these gaps provide stress relieve for the core from mechanical pressures. The stress relief can be simulated and a resulting layout that provides optimum mechanical relief be selected based upon the simulations as well.

Figure 45:
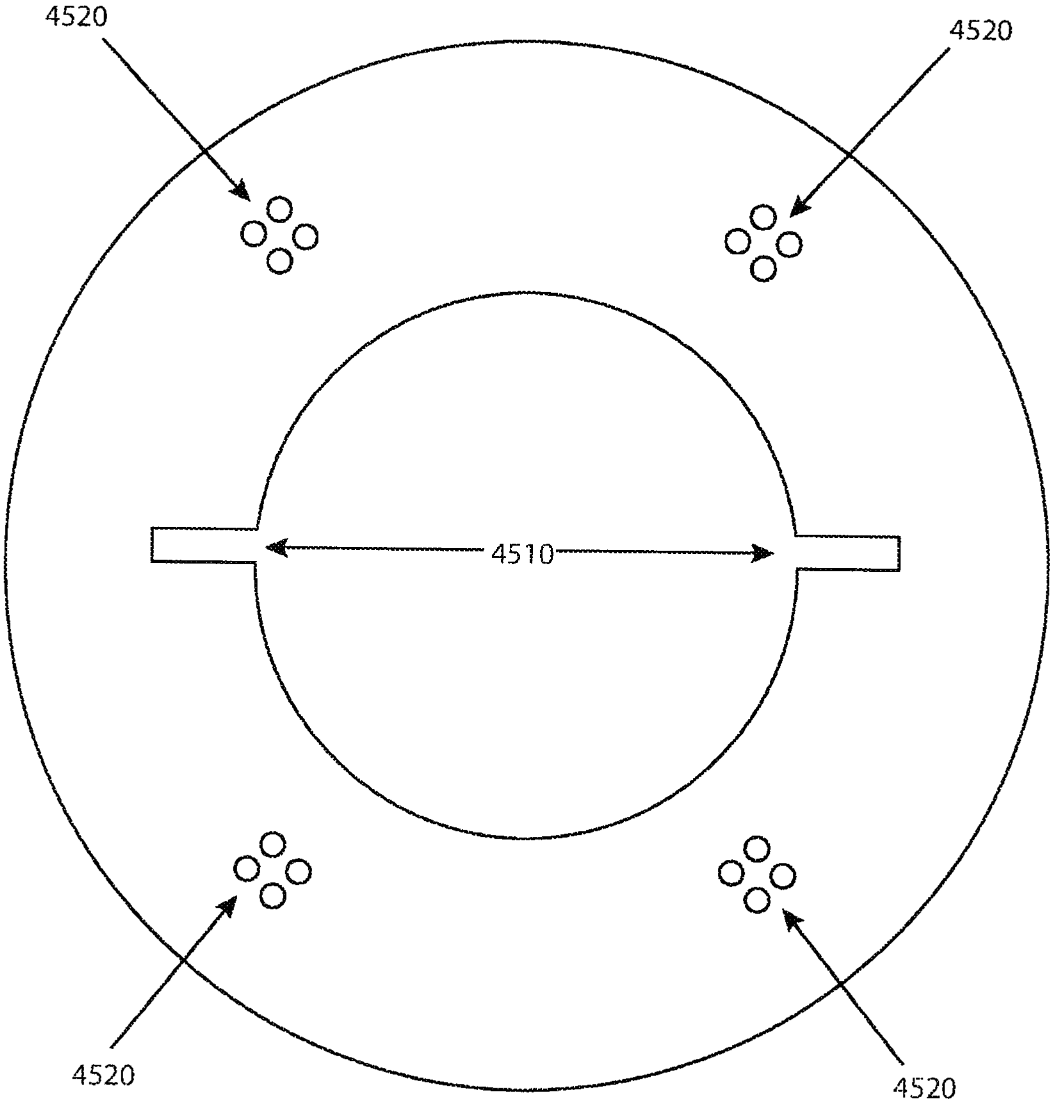
FIG. 45 is a top-down view of a core having four exclusion area filled with air gaps and two partial cuts.

Multiple exclusion areas can be defined on a core. FIG. 45 shows a core having four exclusion areas 4520 and two partial air gaps 4510.

Partial, continuous, and stitch-like patterns can all be combined in a single core to produce a variety of altered inductance over current curves. The implementation of partial gaps, especially more than one, helps prevent the core's capitulation to physical stress, including thermal expansion movements. This is one benefit of grouping a small series of partial area gaps in a single area.

Some examples of cores with air gaps in them are shown in FIGS. 46-50.

Figure 46:
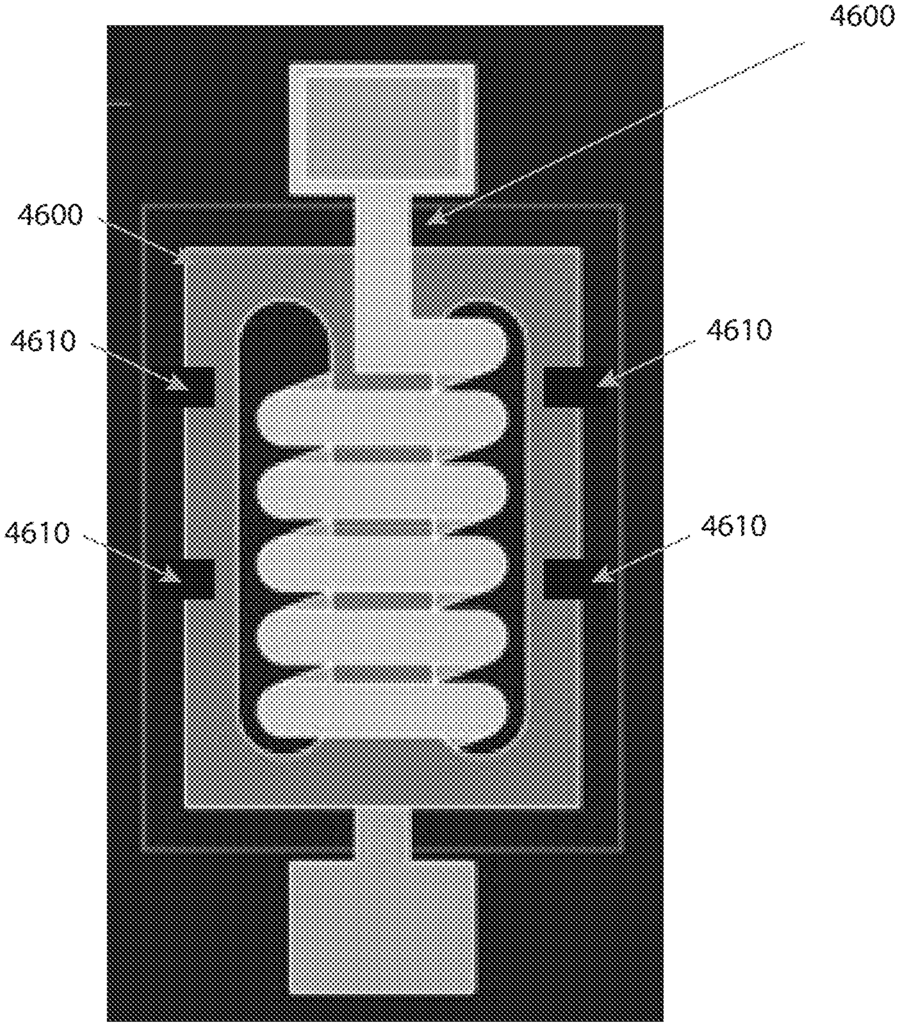
FIG. 46 is a top-down view of the inductor of FIG. 9 now with one partial spiral air gap.

FIG. 46 shows an inductor 4600 with 5.5 coils around a core and four air gaps 4610 on the edges of the core.

Figure 47:
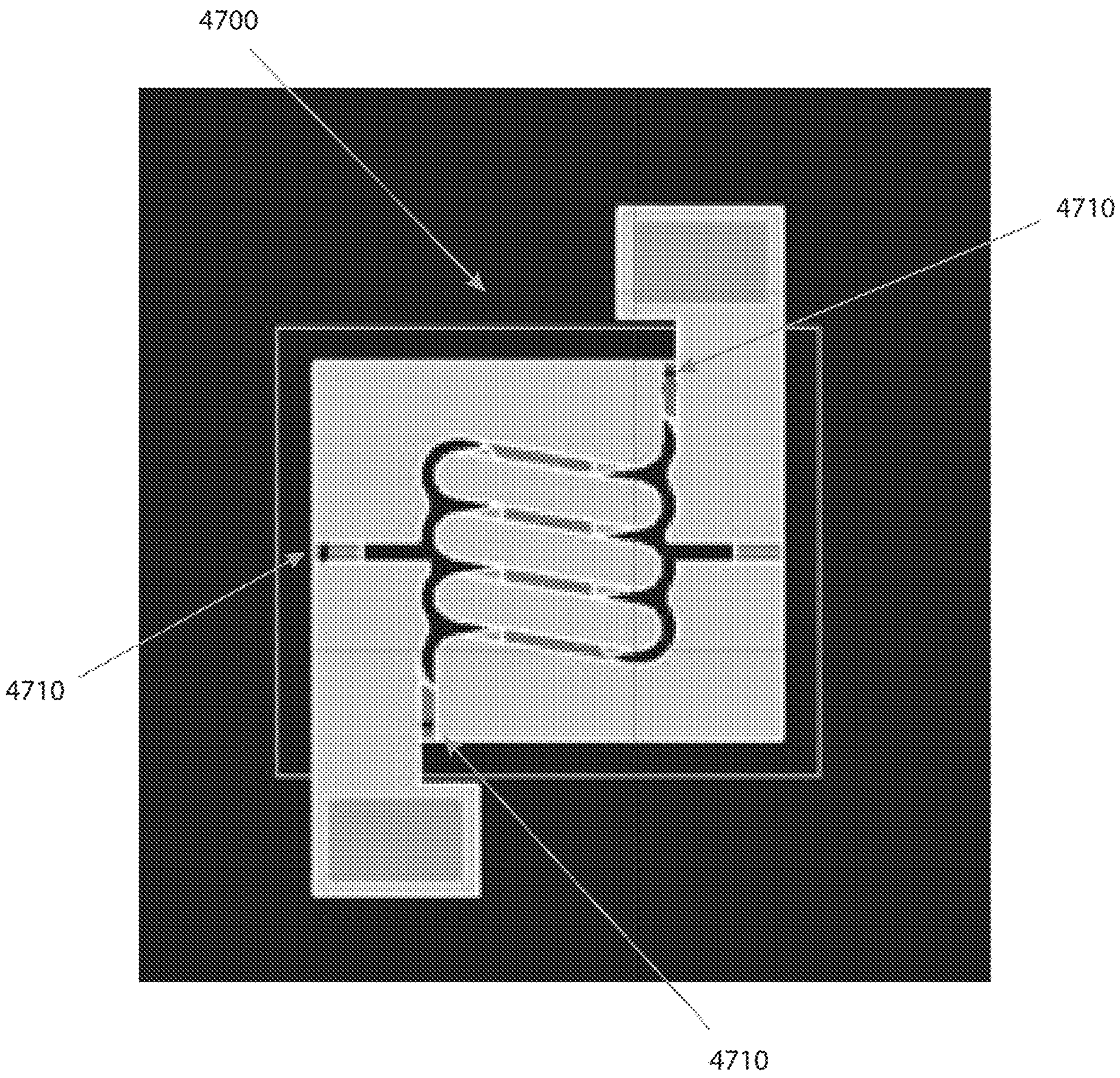
FIG. 47 is a top-down view of the inductor FIG. 10 now with one partial spiral air gap.

FIG. 47 shows an inductor 4700 with 5.0 coil turns and one partial spiral air gap 4710.

Figure 48:
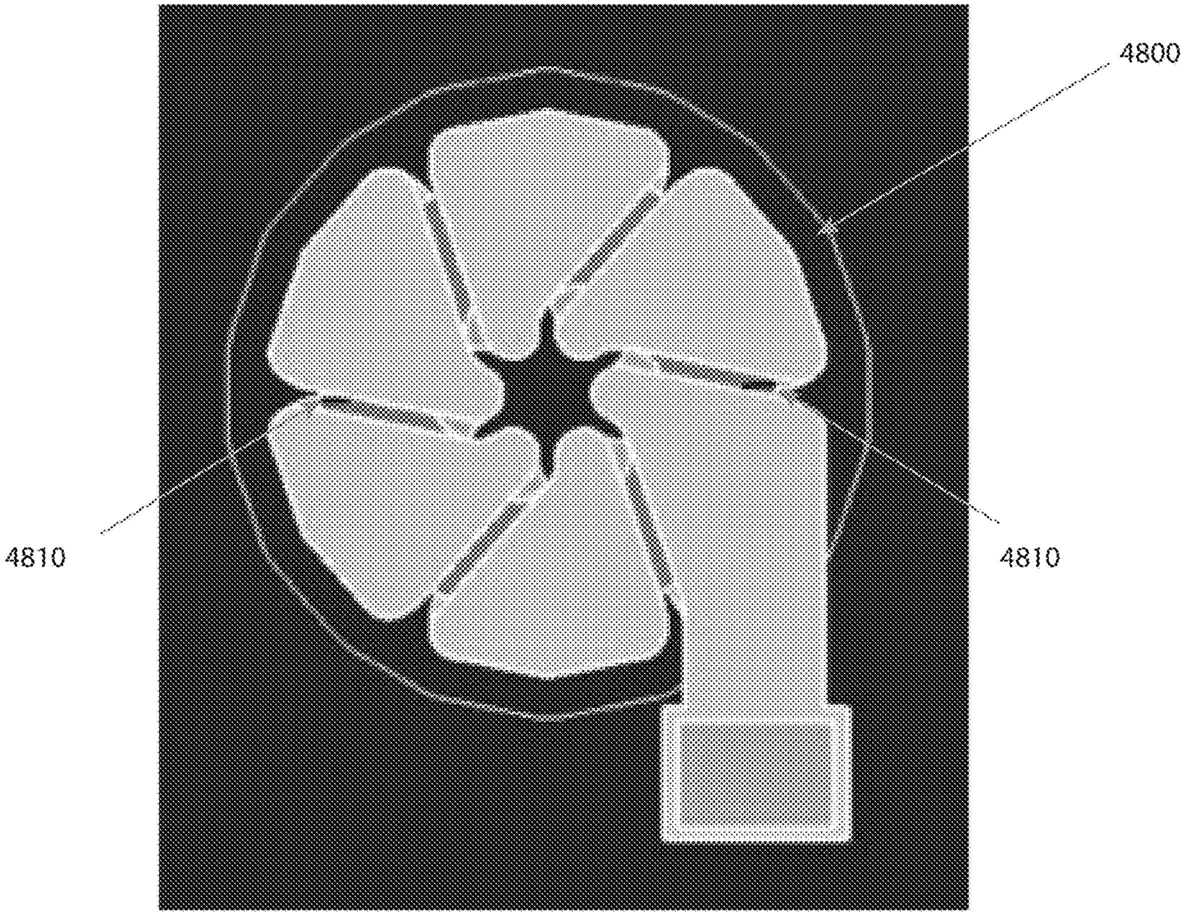
FIG. 48 is a top-down view of the inductor FIG. 11 now with two partial straight air gaps.

FIG. 48 shows an inductor 4800 with 6.0 coil turns and two partial straight air gaps 4810.

Figure 49:
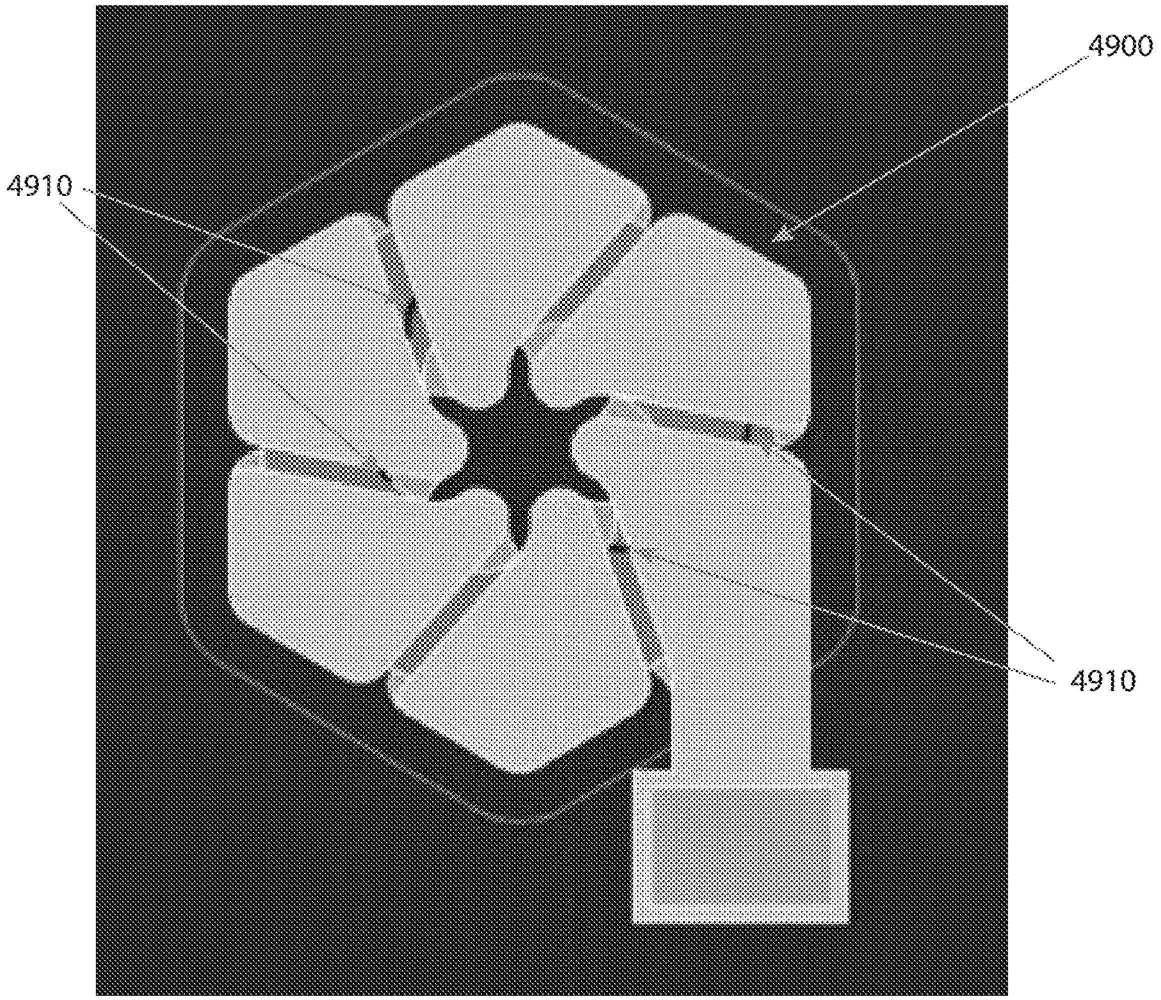
FIG. 49 is a top-down view of the inductor of FIG. 12 now with two partial spiral air gaps that do not extend past 90 degrees from the in-cut angle to the out-cut angle.

FIG. 49 shows an inductor 4900 with 6.0 coil turns and two partial spiral air gaps 4910 that do not extend past 90 degrees from the in cut angle to the out cut angle.

Figure 50:
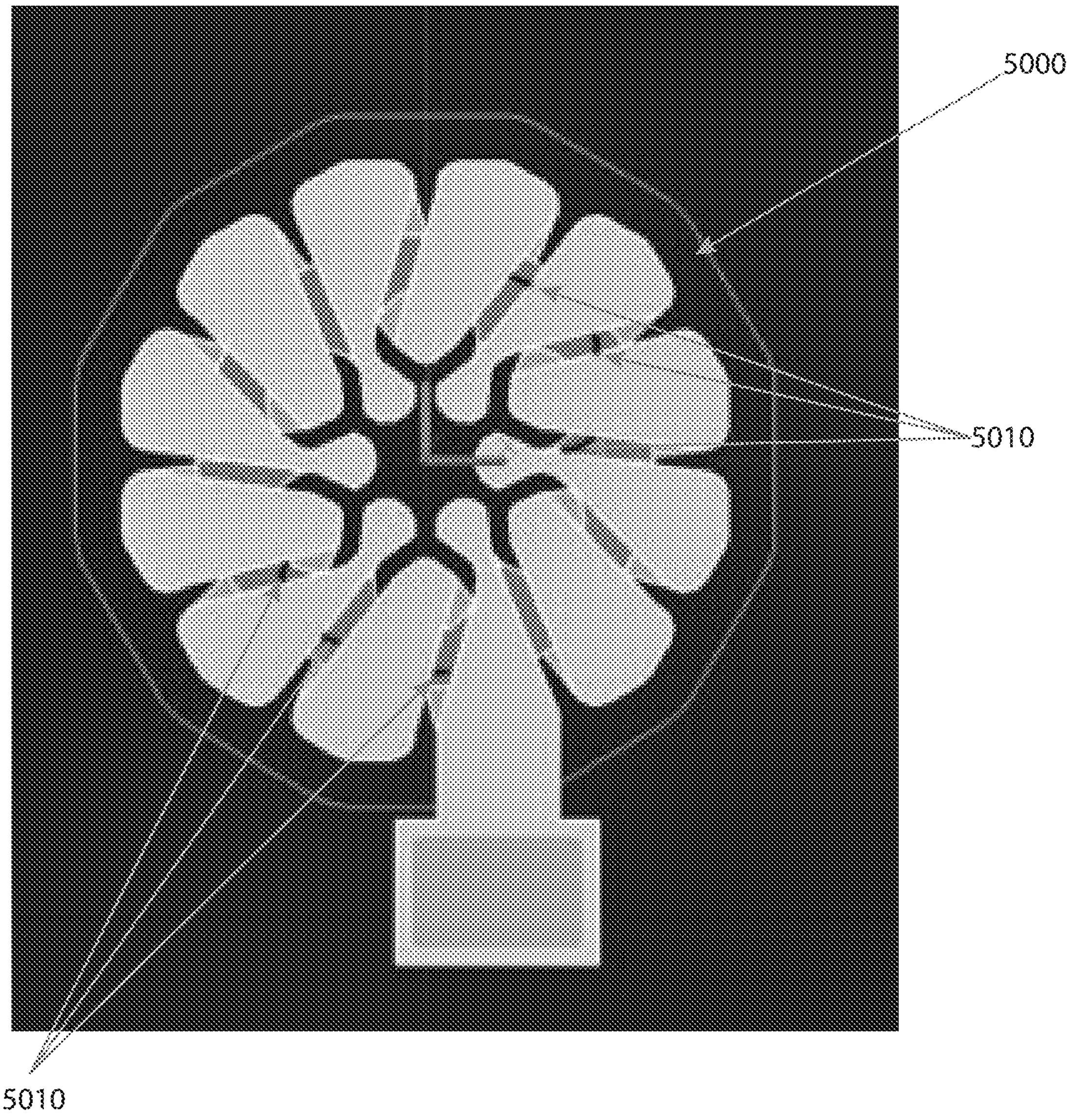
FIG. 50 is a top-down view of the inductor of FIG. 8 now with two partial spiral air gaps.

FIG. 50 shows an inductor 5000 with 12.0 coil turns and two partial spiral air gaps 5010 (a partial spiral air gap being a curved air gap).

After the cuts are generated, the resulting air gaps may be simulated. Note that the cut approximations, like stitching or linear piecewise approximations, may occur before or after the simulation, but the cut generation will come before the simulation. If the approximations come after the simulation, there will be another simulation step.

A user will check the simulation results to see if a usable inductance over current curve has been created. If an altered curve was selected before the cuts were made, then the simulations are compared to the ideal inductance over the current curve. Approximations of the target curve are acceptable. This step first involves a field simulation and construction of a simulation-based "Response Surface" as the function arguments.

As a note, in the preferred embodiment, the air-gap geometry, and its layout for each laminated layer and input deck for the in-house field simulator or any commercially available including Finite Element Method field simulation programs like Maxwell, HFSS, COMSOL, ANYSIS . . . ECT is computer generated. This is preferred because it prevents any simulation input deck errors compared to desired air-gap geometries.

Once the simulation is complete. A user may select the closest match. It might be impossible to match the $L_{TARGET}$ (I) curve exactly, but iteratively, one can define the closest air-gap match.

The cuts and simulations may be done for a single core layer or given to the entire core. The gaps need not be filled with air but may be filled with a specific gas or alloy or even be set as a vacuum. A magnetically permeable material is one that is suitable for the purpose of being used in electrical components to direct magnetic flux lines. The air gaps are possible at any size so long as they are contained by the component. Although partial air gaps may start from any first edge of the core, they may also start from the middle of the core and not touch any edge of the core. However, embodiments of this invention can be limited to partial air gaps that start an edge of the core. The air gaps are possible at any width as dictated by intended use. The gaps may run at any angle. The number of gaps in a magnetic core or on each magnetic core layer may vary, confined only by physical limitations. Each core in a multi-layer core may have a different number of gaps, and some levels may not have any gaps. Insulation may be put between multi-layer gaps, and if the interference of eddy currents or fringing is desired, the gaps may not need to be offset or insulated.

The drawings and figures show multiple embodiments and are intended to be descriptive of particular embodiments but not limited with regards to the scope or number, or style of the embodiments of the invention. The invention may incorporate a myriad of styles and particular embodiments. All figures are prototypes and rough drawings: the final products may be more refined by one skill in the art. Nothing should be construed as critical or essential unless explicitly stated.

The invention claimed is:

1. A computer implemented method of generating at least one miniature laminated magnetic core layer with at least one air gap:

Inputting by a computer, through a graphical user interface, an initial radius, an initial coordinate angle, an end radius, and an end coordinate angle for at least one first cut;

Inputting by the computer, through a graphical user interface, an initial radius, an initial coordinate angle, an end radius, and an end coordinate angle for a number of second cuts matching the number of first cuts;

Generating by a computer at least one air gap layout for the given core layer, each of the air gaps, having a first edge defined by the initial radius, the initial coordinate angle, the end radius, and the end coordinate angle for a first cut and having a second edge defined by the initial radius, the initial coordinate angle, the end radius, and the end coordinate angle for the second;

Generating a first cut and a second cut, forming an approximation of the resulting air gap; wherein the approximation is a stitch-style approximation that follows the edge cuts of the generated air gap; wherein the stitch-style approximation is used to relieve mechanical stress on the operation of the miniature laminated magnetic core;

Determining by the computer in a simulation an inductance over current curve for the given core layer with generated air gap for each generated air gap;

Displaying by the computer the inductance over current curve for the core layer with each generated air gap; and Selecting an air gap generated by the computer for implementation into a core according to the determined inductance over current curve for the core layer with generated air gap.

2. The computer-implemented method of claim 1, further comprising, (i) initially selecting a first target inductance for a first range of current and at least one additional target inductance for a corresponding additional range of current for a given core, thus forming a targeted inductance curve, and (ii) wherein the selection of the air gap generated by the computer is of the air gap core layer having an inductance over current curve determined to best match the targeted inductance over a current curve.

3. The computer-implemented method of claim 1, wherein at least two air gaps are generated on a single layer of the magnetic core by inputting.

4. The computer-implemented method of claim 1, wherein the first cut and the second cut are limited such that the air gap generated does not transverse the core layer from a first edge of the core layer to a second edge of the core layer.

5. The computer-implemented method of claim 1, wherein the inputted first cut and second cut are for a partial spiral such that the end coordinate angle is not 90 degrees beyond the in angle for each cut.

6. The computer-implemented method of claim 1, wherein a first cut and a second cut are formed in at least two magnetic core layers.

7. The computer-implemented method of claim 6, wherein each layer of the core has the same air gap so that a singular air gap cuts completely through the magnetic core.

8. The computer-implemented method of claim 6, wherein the air gap of each layer of the core is at least minimally offset from any air gap of each bordering core layer.

9. A computer-implemented method of generating at least one miniature laminated magnetic core layer with at least one partial air gap:

Inputting by the computer through a graphical user interface at least one air gap radius, density value, and exclusion area;

Generating by a computer an area of the magnetic core layer having a series of air gaps as determined by the air gap radius, density value, and the exclusion area inputs as limited to the area radius input; Determining by the computer the mechanical tolerances of the magnetic core layer having the generated are of air gaps;

Generating a first cut and a second cut, forming an approximation of the resulting air gap; wherein the approximation is a stitch-style approximation that follows the edge cuts of the generated air gap; wherein the stitch-style approximation is used to relieve mechanical stress on the operation of the miniature laminated magnetic core;

Displaying by the computer the mechanical tolerances of the magnetic core layer with computer-generated air gap series; and Selecting an air gap grouping generated by the computer for implementation into a core according to the determined mechanical tolerances of the magnetic core layer of core.

10. The computer-implemented method of claim 8, wherein at least two air gap areas are generated on a single layer of the magnetic core by inputting, by the computer through a graphical user interface, an air gap radius, a density value, and an exclusion radius for each air gap area.

11. The computer-implemented method of claim 1, wherein there is an area of the magnetic core layer having a series of airgaps in at least two magnetic core layers.

12. The computer-implemented method of claim 10, wherein each layer of the core has the same air gap so that a singular air gap cuts completely through the magnetic core.

13. A computer implemented method of generating at least one miniature laminated magnetic core layer with at least one partial air gap:

Inputting by the computer through a graphical user interface an initial radius, an initial coordinate angle, an end radius, and an end coordinate angle for at least one first cut;

Inputting by the computer through a graphical user interface an initial radius, an initial coordinate angle, an end radius, and an end coordinate angle for a number of second cuts matching the number of the first cuts inputted;

Inputting by the computer through a graphical user interface at least one limited core layer area radius, density value, and exclusion radius; Generating by a computer an area of the magnetic core layer having a series of air gaps as determined by the density input and the exclusion input as limited to the area radius input;

Generating by a computer at least one non-grouped air gap pattern for the magnetic core layer, each of the non-grouped air gaps, having a first edge defined by the initial radius, the initial coordinate angle, the end radius, and the end coordinate angle for a first cut and having a second edge defined by the initial radius, the initial coordinate angle, the end radius, and the end coordinate angle for the second cut;

Determining by the computer an inductance over current curve for a core having the given core layer with all generated air gaps for each generated air gap pattern;

Determining by the computer the mechanical tolerances of the magnetic core layer having the generated area of air gaps;

Generating a first cut and a second cut, forming an approximation of the resulting air gap; wherein the approximation is a stitch-style approximation that follows the edge cuts of the generated air gap; wherein the stitch-style approximation is used to relieve mechanical stress on the operation of the miniature laminated magnetic core;

Displaying by the computer the inductance over current curve for the given core with computer-generated air gap; and Selecting an air gap layout generated by the computer for implementation into a core according to the determined inductance over current curve for the given core given the mechanical tolerances of the generated magnetic core.

14. The computer-implemented method of claim 13, further comprising, (i) initially selecting a first target inductance for a first range of current and at least one additional target inductance for a corresponding additional range of current for a given core, thus forming a targeted inductance curve, and (i) wherein the selection of the air gap generated by the computer is of the simulation determined to best match the targeted inductance over current curve.

15. The computer-implemented method of claim 13, further comprising inputting and generating an air gap for multiple layers of the magnetic core.

16. The computer-implemented method of claim 15, wherein each layer of the core has the same air gap so that a singular air gap cuts completely through the magnetic core.

17. The computer-implemented method of claim 15, wherein the air gap of each layer of the core is offset from any air gap of each bordering core layer.

18. The computer-implemented method of claim 1, wherein at least two air gaps are generated on a single layer of the magnetic core.

* * * * *